US009840007B1

(12) United States Patent
Kuffner

(10) Patent No.: US 9,840,007 B1
(45) Date of Patent: Dec. 12, 2017

(54) ROBOTIC OPERATION LIBRARIES

(71) Applicant: X Development LLC, Mountain View, CA (US)

(72) Inventor: James Joseph Kuffner, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 417 days.

(21) Appl. No.: 14/834,191

(22) Filed: Aug. 24, 2015

Related U.S. Application Data

(60) Provisional application No. 62/041,393, filed on Aug. 25, 2014.

(51) Int. Cl.
*B25J 9/16* (2006.01)

(52) U.S. Cl.
CPC ............ *B25J 9/1671* (2013.01); *Y10S 901/31* (2013.01); *Y10S 901/50* (2013.01)

(58) Field of Classification Search
CPC ...... B25J 9/1671; Y10S 901/31; Y10S 901/50
USPC .......................................... 700/245
See application file for complete search history.

(56) References Cited

U.S. PATENT DOCUMENTS

| | | | | |
|---|---|---|---|---|
| 7,269,479 B2 * | 9/2007 | Okamoto | ................. | B25J 5/007 318/568.12 |
| 8,112,176 B2 | 2/2012 | Solomon | | |
| 8,548,777 B2 | 10/2013 | Sturrock | | |
| 8,571,745 B2 | 10/2013 | Pack | | |
| 8,634,982 B2 | 1/2014 | Khosla | | |
| 9,329,587 B2 * | 5/2016 | Fudaba | ................... | G05B 15/02 |
| 9,335,752 B2 * | 5/2016 | Fudaba | ....................... | B25J 3/04 |
| 9,415,516 B2 * | 8/2016 | Fudaba | ................... | B25J 9/1689 |
| 9,516,996 B2 * | 12/2016 | Diolaiti | .............. | A61B 1/00009 |

OTHER PUBLICATIONS

Balakirsky, A Simulation Framework for Evaluating Mobile Robots, National Institute of Standards and Technology, Intelligent Systems Division, Gaithersburg, Maryland.

* cited by examiner

*Primary Examiner* — McDieunel Marc
(74) *Attorney, Agent, or Firm* — McDonnell Boehnen Hulbert & Berghoff LLP

(57) ABSTRACT

Example implementations relate to robotic operations libraries. An example library may include sets of operation instructions and other information for robotic devices to use to complete desired tasks. For instance, a respective set of operation instructions is determined based on successive simulations in which a virtual robotic device comprising an adjustable configuration initially based on the given configuration of a robotic device performs operations related to a task in an adjustable virtual environment until one or more simulations result in the virtual robotic device performing respective operations that complete the task at a success level that satisfies a predefined threshold. The library may provide a set of instructions for performing operations to a robotic device based on a query received from the robotic device that includes information indicative of a configuration and an environment of the robotic device.

20 Claims, 9 Drawing Sheets

ROBOTIC OPERATION LIBRARIES

CROSS-REFERENCES TO RELATED APPLICATIONS

The present application claims priority to U.S. Provisional patent application Ser. No. 62/041,393, filed Aug. 25, 2014, and entitled "Robotic Operation Libraries," the entire contents of which are herein incorporated by reference.

BACKGROUND

Unless otherwise indicated herein, the materials described in this section are not prior art to the claims in this application and are not admitted to be prior art by inclusion in this section.

As technology advances, various types of robotic devices are being created for performing a variety of functions that may assist users. Robotic devices may be used for applications involving material handling, transportation, welding, assembly, and dispensing, among others. Over time, the manner in which these robotic systems operate is becoming more intelligent, efficient, and more intuitive. As robotic systems become increasingly prevalent in numerous aspects of modern life, the desire for efficient robotic systems becomes apparent. Therefore, a demand for efficient robotic systems has helped open up a field of innovation in actuators, movement, sensing techniques, as well as component design and assembly. Robotic systems are being expected to move and operate efficiently to perform new tasks and functions.

SUMMARY

Examples may relate robotic operation libraries. In some implementations, a computing system may maintain and operate a library that includes one or more sets of instructions developed to enable robotic devices execute operations related to desired tasks. The computing system may operate the library in a "cloud" and enable different types of robotic devices to access the various sets of instructions by communicating queries to the library that specify parameters associated with a desired task. A query (e.g., request) for assistance submitted by a robotic device to the library may enable the library computing system to analyze information associated with the robotic device, including the desired task of the robotic device, and search the library for one or more sets of instructions for operations that may enable the robotic device to likely complete the task. The library may organize and provide instructions or other type of information to a given robotic device based on the desired task, environment, configuration, and/or other parameters associated with the given robotic device.

To develop and store the different operation instructions for a variety of robotic devices, the library computing system may use one or more simulators equipped with physics engines to simulate adjustable virtual robotic devices testing possible operations in adjustable virtual environments. A series of simulations may enable the computing system to development instructions for successful operations by adjusting one or more parameters of the simulation based on the results of the simulation. For example, the computing system may test the likelihood of success for different configurations of robotic devices performing various operations by running successive simulations with adjustments to one or more parameters associated with the virtual robotic device, operations, and/or environment. In some instances, the library computing system may develop instructions for operations that enable a robotic device having a given configuration to successfully complete a task within a threshold rate of success.

In one example, the present application describes a method. The method may comprise maintaining, at a computing system, a library having sets of instructions for robotic devices to use to perform respective operations. A given set of instructions may enable a robotic device having a given configuration to perform respective operations related to completing a task. Additionally, the given set of instructions may be determined based on a set of successive simulations in which a virtual robotic device comprising an adjustable configuration initially based on the given configuration of the robotic device performs a plurality of operations related to the task in an adjustable virtual environment until one or more simulations of the set of successive simulations results in the virtual robotic device performing respective operations that complete the task at a success level that satisfies a predefined threshold. The method may also include receiving, at the computing system, a query from a first robotic device requesting instructions for performing operations related to a first task. The query may include information indicative of a configuration and an environment of the first robotic device. The method may also include identifying a set of instructions of the library for performing operations related to the first task based on the query including the configuration of the first robotic device, and providing, by the computing system, the identified set of instructions to the first robotic device based on the identified set of instructions of the library for performing operations related to the first task.

In another example, the application describes a system that comprises at least one processor, and data storage comprising instructions executable by the at least one processor to cause the system to perform functions. The functions may comprise maintaining a library having sets of instructions for robotic devices to use to perform respective operations. A given set of instructions of the library may enable a robotic device having a given configuration to perform respective operations related to completing a task. Additionally, the given set of instructions may be determined based on a set of successive simulations in which a virtual robotic device comprising an adjustable configuration initially based on the given configuration of the robotic device performs a plurality of operations related to the task in an adjustable virtual environment until one or more simulations of the set of successive simulations results in the virtual robotic device performing respective operations that complete the task at a success level that satisfies a predefined threshold. Furthermore, the functions may include receiving a query from a first robotic device requesting instructions for performing operations related to a first task. The query may include information indicative of a configuration and an environment of the first robotic device. In addition, the functions may include identifying a set of instructions of the library for performing operations related to the first task based on the query including the configuration of the first robotic device, and providing the identified set of instructions to the first robotic device based on the identified set of instructions of the library for performing operations related to the first task.

In a further example, the present application describes another method. The method may comprise receiving, at a computing system, information indicative of a configuration of a first robotic device. The method may include performing a first series of simulations comprising an adjustable virtual robotic device having a virtual configuration initially based on the configuration of the first robotic device executing one or more operations related to a task in an adjustable virtual environment. In some examples, successive simulations in the first series of simulations may differ based on one or more adjustments to the virtual configuration of the adjustable virtual robotic device, the one or more operations, and the adjustable virtual environment. The method may include identifying one or more simulations of the first series of simulations in which the adjustable virtual robotic device executed respective operations related to the task at a success level that satisfies a predefined threshold based on the first series of simulations. The method may also include generating one or more sets of instructions that enable one or more robotic devices having respective configurations similar to the configuration of the first robotic device execute the respective operations related to the task based on the identified one or more simulations of the first series of simulations. Additionally, the method may also include storing, by the computing system, the one or more sets of instructions for providing to the one or more robotic devices.

In still another example, a system is provided that comprises a means for maintaining a library having sets of instructions for robotic devices to use to perform respective operations. A given set of instructions of the library may enable a robotic device having a given configuration to perform respective operations related to completing a task. Additionally, the given set of instructions may be determined based on a set of successive simulations in which a virtual robotic device comprising an adjustable configuration initially based on the given configuration of the robotic device performs a plurality of operations related to the task in an adjustable virtual environment until one or more simulations of the set of successive simulations results in the virtual robotic device performing respective operations that complete the task at a success level that satisfies a predefined threshold. Furthermore, the system may include a means for receiving a query from a first robotic device requesting instructions for performing operations related to a first task. The query may include information indicative of a configuration and an environment of the first robotic device. In addition, the system may include a means for identifying a set of instructions of the library for performing operations related to the first task based on the query including the configuration of the first robotic device, and a means for providing the identified set of instructions to the first robotic device based on the identified set of instructions of the library for performing operations related to the first task.

These as well as other aspects, advantages, and alternatives, will become apparent to those of ordinary skill in the art by reading the following detailed description, with reference where appropriate to the accompanying figures.

DETAILED DESCRIPTION

Figure 1:
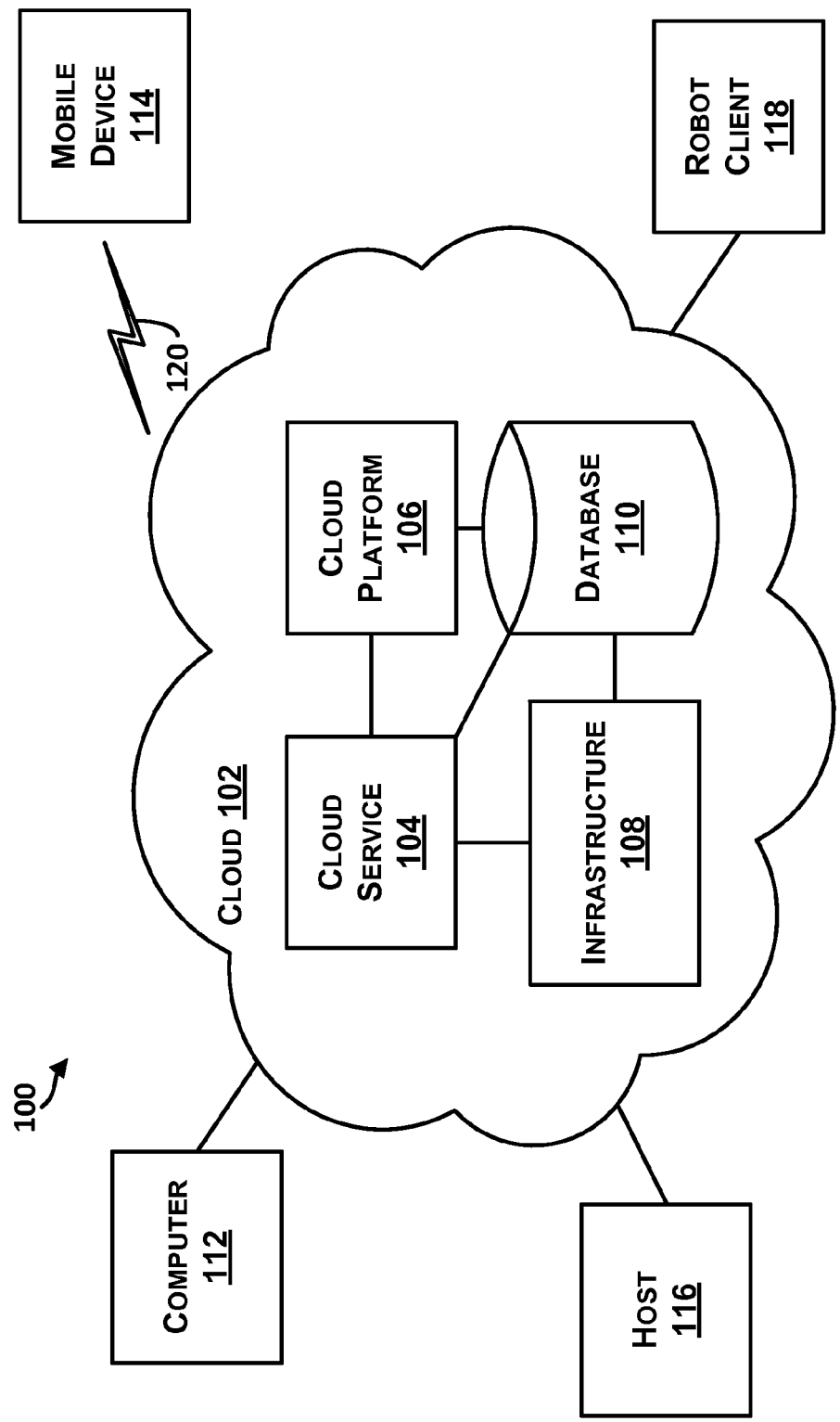
FIG. 1 is an example system for cloud-based computing.

The following detailed description describes various features and functions of the disclosed systems and methods with reference to the accompanying figures. In the figures, similar symbols identify similar components, unless context dictates otherwise. The illustrative system and method embodiments described herein are not meant to be limiting. It may be readily understood that certain aspects of the disclosed systems and methods can be arranged and combined in a wide variety of different configurations, all of which are contemplated herein.

A robotic device may be configured according to a design aimed to enable the robotic device to complete particular tasks during operation. To perform a desired task, a computing system controlling a robotic device may be programmed and tested manually to determine proper operations for completing the desired task. Programming and testing the robotic device may require a user to physically manipulate the robotic device in a series of time-extensive tests. The tests may involve a user configuring the robotic device to perform different possible operations until successfully completing a given task. Thus, enabling a robotic device to perform operations, especially new or complex procedures, can be a rigorous process. Furthermore, the manual testing of new operations may not result in the robotic device using the most efficient operations available.

To reduce the complexity and time often required to train a robotic device, the robotic device may rely on previously determined instructions for executing desired operations. In some instances, the robotic device may access operation instructions from memory associated with the robotic device, which may correspond to prior operations by the robotic device. Similarly, the computing system may send/receive instructions for executing operations from other robotic devices.

In some instances, however, a robotic device may not be able to receive operation instructions from memory associated with the robotic device and/or from other robotic devices. The robotic device may encounter particular operations, including new operations, which the robotic device and other available robotic devices may not have previously experienced or successfully completed. As such, the robotic device may not have access to information (e.g., instructions) that provides a procedure for completing the task.

To overcome a possible lack of instructions, the robotic device may access instructions for executing operations related to a given task from a robotic operations library ("library") that stores operation instructions for robotic devices. The library may serve operations related to storing and providing robotic devices with instructions and/or other information for completing desired tasks or systems calibration, for example. The library may exist on one or multiple computing systems (e.g., within a "cloud") and may store instructions for a variety of robotic devices to access and use. That way, the information within the library may increase the overall robustness and speed of development associated with operating and configuring robotic devices. The library, also referred to herein in as the cloud, library system, database, server, etc., is described herein as a single library, but may also be configured different, such as multiple libraries that store instructions and/or simulations for robotic devices to access.

In some instances, a given set of instructions within the library may enable a robotic device having a particular configuration or component perform one or more operations. As such, use of the instructions by a robotic device may depend on the configuration of the robotic device and possibly other parameters, such as available power, the desired task, the environment, etc. For example, a robotic device with two legs may not be able to use a set of instructions developed to enable locomotion operation of a quadruped robotic device. In such a case, a quadruped robotic device may likely use the set of instructions to perform the locomotion activity, but the instructions may also be further limited to quadruped robotic devices having a particular configuration, such as four of a particular type of robotic leg, or may depend on the environment or other factors associated with the situation of the robotic device.

In some implementations, to develop and test the various sets of instructions stored within the library, the library computing system may use one or more simulators to simulate possible actions that a robotic device may perform. A simulator may simulate possible operations using an adjustable virtual robotic device to determine whether a robotic device having a given configuration corresponding to the virtual configuration of the virtual robotic device can successfully complete a respective operation. Thus, the simulator may use various configurations of virtual robotic devices to test operations for a range of robotic devices having different configurations. Additionally, the simulator may adjust the configuration, including components, of the virtual robotic device within simulations.

Similarly, in some instances, the simulator(s) may test operations for particular components rather than entire assemblies of robotic devices. This way, a robotic device may change configurations (e.g., add or change components) using simulation results to help access possible future operations that a given component may enable. Having instructions for operations specific to components may enable a user and/or robotic device to actively change the configuration of the robotic device with the ability to foresee the potential success of operations that the new component may provide without physically testing the component or entire assembly involving the component.

To ensure accurate and efficient results within simulations, the simulator(s) may include one or more physics engines configured to apply forces to the virtual robotic device during virtual operations. To increase accuracy, a physics engine may help replicate environments and forces (e.g., center of gravities) that a robotic device or components may experience operating in the real-world. Further, the physics engine(s) may have adjustable parameters that enable the simulator to adjust the forces, environment, soft or rigid body dynamics, or other parameters that may apply during a given simulation.

In some instances, the simulator may test a given operation or operations across a series of simulations. Successive simulations may include one or more changes in parameters associated with the virtual robotic devices, operations, and the virtual environment, to enable the simulator to identify positive or negative results caused by the one or more changes. The simulator may use a series of simulations to help identify positive or negative changes in one or more parameters of the simulation and adjust the next simulation within the series accordingly.

As an example, to determine proper operations for a mechanical gripper component, the simulator may run an initial simulation having the mechanical gripper attempting to grasp an object using a first motion and obtain the results. In a follow up simulation, the simulator may run another simulation with the same mechanical gripper component attempting to grasp the object using a second motion that slightly differs from the first motion. Based on the results of the simulation using the second motion compared to the results of simulation using the first motion, the simulator may make another adjustment having the mechanical gripper attempting to grasp the object using a third motion that may slightly differ from the first motion and/or the second motion. Additionally, the simulator may adjust other parameters outside the motion performed by the mechanical gripper, such as adjusting the size of the object within successive simulations or the configuration, position, material, or other parameters associated with the mechanical gripper.

Through multiple series of simulations, the library computing system may develop and obtain instructions for a range of operations for many types of robotic devices and a variety of components in different scenarios (e.g., multiple environments). For example, the library may include instructions that enable robotic devices with similar configurations to perform similar operations to complete a given task. The library may store sets of instructions developed for multiple types of robotic devices, including taking into account the configurations, sizes, materials, and other possible parameters associated with the robotic devices.

The simulator may adjust the virtual robotic device to reflect the configuration information received to improve the accuracy of the simulations. As such, the simulator may perform component unit testing that enables continuous operations and unit testing of an entire software stack without having to use a physical robotic device.

Furthermore, a simulator may use different virtual environments across multiple simulations. The simulator may adjust one or more parameters of the virtual environment to reflect potential environments that a given robotic device may encounter in the real-world. For example, the simulator may use different temperatures, weather conditions, and forces within virtual environments. Similarly, the simulator may adjust the location, position, orientation, and other parameters associated with the objects in the environment. The adjustments may change the position and orientation of virtual robotic device(s) relative to objects to mirror situations that may occur in the real-world. In some instances, the virtual environments may be adjusted based on sensor information corresponding to the environment of a robotic device, for example.

Additionally, the library may serve for large-scale regression testing, which may involve virtual robotic devices across a regression test suite of input tasks and environments to automatically and efficiently identify software errors. The identified software errors may negatively impact the overall performance and robustness of the physical robotic device.

The library system storing simulations and/or sets of instructions for operating may be used by robotic device(s) for debugging interfaces and/or determining procedures for completing tasks. The robotic devices may access the information stored within the library to use for performing operations as well as identifying possible errors that may exist in the software of the robotic device. Among possible benefits, the robotic device may identify more efficient ways for executing operations through analyzing and utilizing instructions provided within the library. Further, online visualization of future planned motions and robot intentions prior to execution may enable a robotic device to use the library to catch potential failures or dangers prior to the dangers occurring. The library may enable real-time visualization and introspection of robot internal state.

In some implementations, in order to provide the instructions and other possible information to robotic devices, the library computing system may communicate instructions and other information in response to receiving requests (e.g., queries) from robotic devices. A query may include information indicative of the desired task, the configuration of the robotic device, and the surrounding environment, for example. Based on the information of the query, the library computing system may search previously stored simulations and/or instructions to determine operations for the robotic device to use. In some instances, the library computing system may use a simulator to simulate possible operations based on a received query. Furthermore, in some implementations, the library computing system may receive results from robotic devices performing operations to adjust and update stored instructions to reflect the success of actual performances by robotic devices.

In another example implementation, a library computing system may receive information indicative of a configuration of a robotic device. The information may specify information corresponding to the structure, components, position, orientation, assembly, and/or other information about the robotic device. In some instances, the robotic device may be a single robotic component or multiple robotic components, which may be assembled or unassembled. The library computing system may perform a series of simulations in which an adjustable virtual robotic device having a virtual configuration initially based on the configuration of the first robotic device executes respective operation(s) related to a task in an adjustable virtual environment. Successive simulations in the series of simulations may differ based on one or more adjustments to the virtual configuration of the adjustable virtual robotic device, the one or more operations, and/or the adjustable virtual environment.

The library computing system may, based on the series of simulations, identify one or more simulations of the first series of simulations in which the adjustable virtual robotic device executed respective operations related to the task at a success level that satisfies a predefined threshold. The success level may correspond to a success rate or other confidence measure. The library computing system may further generate one or more sets of instructions, based on identified simulations of the series of simulations, that enable one or more robotic devices having respective configurations similar to the configuration of the initial robotic device execute the operations related to the task. Furthermore, the library computing system may store the generated sets of instructions within storage (e.g., within the cloud) to provide to robotic devices for use.

In some implementations, the library computing system may repeat this process or similar processes to develop instructions for other operations and robotic devices with other configurations. Other processes or techniques may be used by the computing system to develop instructions and/or other information for the library.

In some implementations, cloud-based simulation is used for regression testing. For example, when a portion of code is updated (whether by a developer or automatically), regression testing can be carried out by evaluating performance of updated code against one or more performance metrics. For example, a set of tests can be used, with each test defining input parameters and corresponding acceptable output parameters. As a particular example, a test can define an execution environment for a robot, initial arrangement of objects, desired end arrangement of objects, and metrics for evaluating success or failure of the task (e.g., maximum time to carry out the task, error conditions such as forces/motions that would damage the objects, etc.).

The code being tested can then be executed in the simulated environment along with other code for the task to be performed to see how close the simulated robot's behavior tracks the expected behavior or otherwise meets the requirements for the test. Expected behavior can be evaluated in the course of executing the task and/or when the task is complete. In this manner, a change that improves part of the code for a particular task but causes some unintended behavior when combined with another portion of code used in that task can be flagged for further work. Other examples of regression testing may be used.

Referring now to the figures, FIG. 1 is an example system for cloud-based computing. Cloud-based computing generally refers to networked computer architectures in which application execution and storage may be divided, to some extent, between client and server devices. A "cloud" may refer to a service or a group of services accessible over a network (e.g., Internet) by client and server devices, for example. As shown in FIG. 1, example cloud system 100 includes cloud 102 having cloud service 104, cloud platform 106, cloud infrastructure 108, and a database 110. Further, cloud system 100 includes computer 112, mobile device 114, host 116, and robot client 118 communicating with cloud 102. Cloud system 100 may include more or less components, including other entities communicating with cloud 102. Other configurations of cloud system 100 may exist.

Cloud 102 may include more or fewer components, and each of the cloud service 104, the cloud platform 106, the cloud infrastructure 108, and the database 110 may comprise multiple elements as well. Thus, one or more of the described functions of the system 100 may be divided into additional functional or physical components, or combined into fewer functional or physical components. In some further examples, additional functional and/or physical components may be added to the examples illustrated by FIG. 1. Delivery of cloud computing may involve multiple cloud components communicating with each other over application programming interfaces, such as web services and three-tier architectures, for example.

Cloud 102 may represent networking computer architecture, and in one example, the cloud service 104 represents a queue for handling requests from client devices. The cloud platform 106 may include a frontend of the cloud and may be coupled to the cloud service 104 to perform functions to interact with client devices. The cloud platform 106 may include applications used to access cloud 102 via a user interface, such as a web browser. The cloud infrastructure 108 may include service application of billing components of cloud 102, and thus, may interact with the cloud service 104. The database 110 may represent storage capabilities by cloud 102, and thus, may be accessed by any of the cloud service 104, the cloud platform 106, and/or the infrastructure 108.

Cloud system 100 includes a number of client devices coupled to or configured to be capable of communicating with components of cloud 102. For example, a computer 112, a mobile device 114, a host 116, and a robot client 118 are shown coupled to cloud 102. Of course, more or fewer client devices may be coupled to cloud 102. In addition, different types of client devices may be coupled to cloud 102. For example, any of the client devices may generally comprise a display system, memory, and a processor.

The computer 112 may be any type of computing device (e.g., PC, laptop computer, etc.), and the mobile device 114 may be any type of mobile computing device (e.g., laptop, mobile telephone, cellular telephone, etc.). Other types of computing devices may communicate with cloud 102.

The host 116 may be any type of computing device with a transmitter/receiver including a laptop computer, a mobile telephone, etc., that is configured to transmit/receive data to/from cloud 102.

The robot client 118 may comprise any computing device that has connection abilities to cloud 102 and that has an actuation capability (e.g., electromechanical capabilities). A robotic device may further be a combination of computing devices. In some examples, the robot 118 may collect data and upload the data to cloud 102. Cloud 102 may be configured to perform calculations or analysis on the data and return processed data to the robot client 118. In some examples, as shown in FIG. 1, cloud 102 may include a computer that is not co-located with the robot client 118. In other examples, the robot client 118 may send data to a second client (e.g., computer 112) for processing.

Any of the client devices may include additional components. For example, the robot client 118 may include one or more sensors, such as a gyroscope or an accelerometer to measure movement of the robot client 118. Other sensors may further include any of Global Positioning System (GPS) receivers, infrared sensors, sonar, optical sensors, biosensors, Radio Frequency identification (RFID) systems, Near Field Communication (NFC) chip, wireless sensors, and/or compasses, among others, for example.

In addition, any of the client devices may include an integrated user-interface (UI) that allows a user to interact with the device. For example, the robot client 118 may include various buttons and/or a touchscreen interface that allow a user to provide input. As another example, the robot client device 118 may include a microphone configured to receive voice commands from a user. Furthermore, the robot client 118 may include one or more interfaces that allow various types of user-interface devices to be connected to the robot client 118.

Communication links between client devices (e.g., robot client device 118) and cloud 102 may include wired connections, such as a serial or parallel bus. Communication links may also be wireless links, such as link 120, which may include Bluetooth, IEEE 802.11 (IEEE 802.11 may refer to IEEE 802.11-2007, IEEE 802.11n-2009, or any other IEEE 802.11 revision), or other wireless based communication links.

In other examples, the system 100 may include access points through which the client devices may communicate with cloud 102. Access points may take various forms, for example, an access point may take the form of a wireless access point (WAP) or wireless router. As another example, if a client device connects using a cellular air-interface protocol, such as a CDMA or GSM protocol, an access point may be a base station in a cellular network that provides Internet connectivity via the cellular network.

As such, the client devices may include a wired or wireless network interface through which the client devices can connect to cloud 102 (or access points). As an example, the client devices may be configured use one or more protocols such as 802.11, 802.16 (WiMAX), LTE, GSM, GPRS, CDMA, EV-DO, and/or HSPDA, among others. Furthermore, the client devices may be configured to use multiple wired and/or wireless protocols, such as "3G" or "4G" data connectivity using a cellular communication protocol (e.g., CDMA, GSM, or WiMAX, as well as for "Wi-Fi" connectivity using 802.11). Other examples are also possible.

Figure 2A:
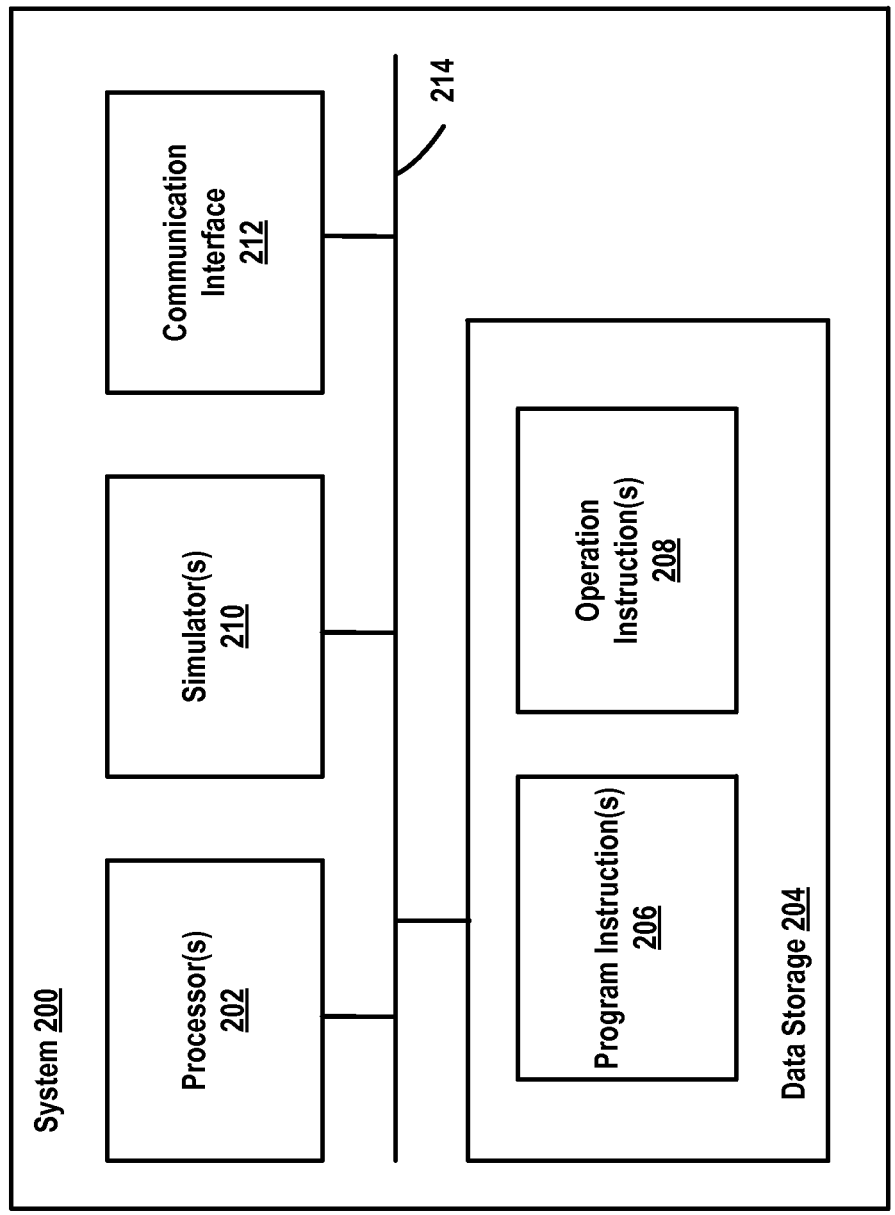
FIG. 2A illustrates an example system for implementing a library of instructions for robotic devices.

FIG. 2A illustrates an example system for implementing a library of instructions for robotic devices. System 200 includes processor(s) 202, data storage 204 storing program instruction(s) 206 and operation instruction(s) 208, simulator(s) 210, and communication interface 212. The different components within system 200 may connect via wired connections (e.g., wired connection 214) or wireless connections. Additionally, system 200 may exist in other configurations, which may include more or less components. In some examples, components of system 200 may be positioned on multiple entities rather on a single entity. Other example illustrations of system 200 may exist.

System 200 may correspond to a library storage system storing sets of instructions for robotic operations and other possible information. System 200 may operate within the cloud and may be configured to limit access to particular robotic devices.

Processor(s) 202 may operate as general-purpose processor(s) or a special purpose processor(s) (e.g., digital signal processors, application specific integrated circuits, etc.). The processor(s) 202 can be configured to execute computer-readable program instructions 106 that are stored in the data storage 204. The processor(s) 202 may execute programs or processes as a result of receiving inputs, such as sensor data.

The data storage 204 may exist as any one or more various types of storage configured to hold memory. For example, the data storage 104 may include or take the form of one or more non-transitory computer-readable storage media that can be read or accessed by processor(s) 202. The one or more computer-readable storage media can include volatile and/or non-volatile storage components, such as optical, magnetic, organic or other memory or disc storage, which can be integrated in whole or in part with processor(s) 202. In some implementations, the data storage 204 may be a single physical device (e.g., one optical, magnetic, organic or other memory or disc storage unit), while in other implementations, the data storage 204 can be implemented using two or more physical devices, which may communicate via wired or wireless communication. Further, in addition to the non-transitory computer-readable program instructions 206, the data storage 204 may include additional data such as diagnostic data, among other possibilities.

In some implementations, system 200 may include one or more controllers that may perform different operations. The controllers may correspond to processor(s) 202, data storage 204, and the non-transitory computer-readable program instructions. In some instances, the controllers may serve as a link between components of system 200.

Operation instruction(s) 208 may exist within the system 200 and may enable robotic devices to perform operations. A set of instructions within the operation instruction(s) 208 may apply to robotic devices having a particular configuration. For example, the library system 200 may organize the operation instruction(s) 208 based on configurations of robotic devices. Additionally, the organization instruction(s) 208 may be further organized based on applicable environments and/or other parameters associated with robotic devices requesting information from the library system 200.

In some instances, the operation instructions 208 may include instructions that correspond to particular components. For example, one or more sets of operation instructions 208 may correspond to a given component (e.g., mechanical gripper).

The simulator(s) 210 may include any type of simulator able to perform computing simulations. A simulator 210 may perform imitations of operations of a real-world process or processes over time. By referring to simulations, robotic devices may optimize performance, including improving safety and efficiency in executing procedures. The simulator(s) 210 may be configured to develop the operation instruction(s) 208. By changing variables across one or more simulations, predications may be made about the behavior of a system. A simulator may enable fast robotic device prototyping.

A simulator 210 may be configured to continuously run simulations testing different possible combinations. In some instances, the simulator 210 may operate based on a predefined frequency, which may involve running simulations periodically according to the frequency. In some implementations, the simulator 210 may operate based on requests from robotic devices and store the results. As such, the simulator 210 may receive a signal from the system 200 that indicates that the simulator 210 should run a simulation that corresponds to a request from a robotic device. The simulator 210 may analyze information provided by the robotic device to configure one or more simulations to fulfill the request for the robotic device.

Figure 2B:
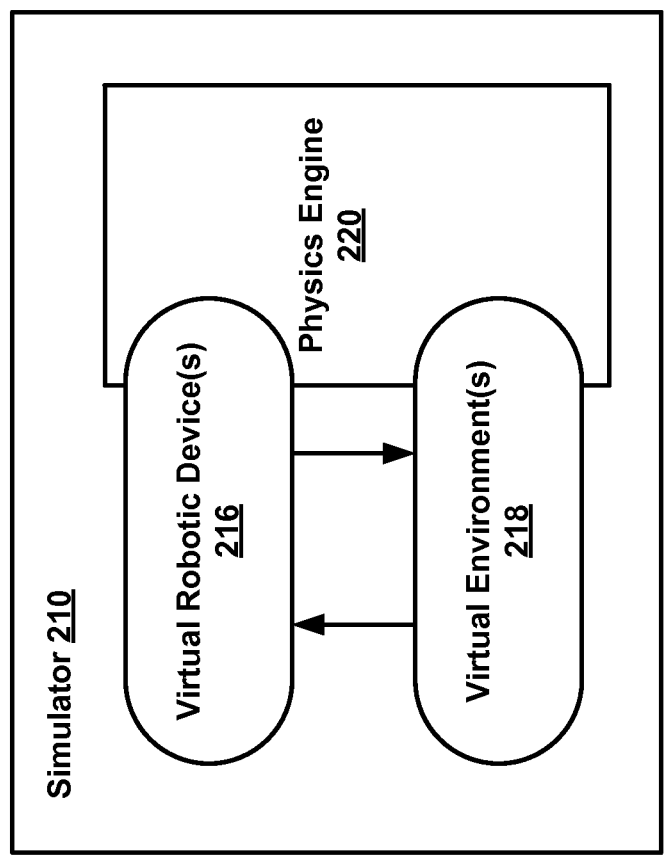
FIG. 2B illustrates an example simulator for developing operation instructions.

FIG. 2B illustrates an example simulator for developing operation instructions. Example simulator 210 includes virtual robotic device(s) 216, virtual environment(s) 218, and physics engine 220. Additionally, simulator 210 may include more or less components within other implementations.

To develop instructions for robotic devices to use for performing operations, the simulator 210 may include one or more virtual robotic device(s) 216 to simulate the performance of operations in one or more virtual environment(s) 218. Virtual robotic device(s) 216 may include any type of robotic device or similar entities and may be include an adjustable configuration. Virtual robotic devices 216 may include robotic devices having various configurations, such as biped or quadruped robotic devices.

In some implementations, a virtual robotic device 216 may correspond to one or more components that may be part of a robotic device or another entity. For example, the simulator 210 may simulate possible operations and situations involving a robotic arm, mechanical gripper, extendable leg, or other possible components. As such, the simulator 210 may enable the simulation and testing of individual components that may make up a robotic device.

Furthermore, the simulator 210 may be configured to adjust the configuration of a virtual robotic device 216. Adjusting the configuration of the virtual robotic device 216 may enable the simulator 210 to test different possible combinations that a virtual robotic device 216 may include. The simulator 210 may adjust individual components, groups of components, and/or entire virtual robotic devices 216 across a range of simulations.

In some implementations, the simulator 210 may receive information associated with a real-world robotic device and may determine a virtual robotic device 216 that includes a virtual configuration that corresponds to the physical robotic device. The simulator 210 may use the virtual robotic device 216 to perform operations related to various tasks across a series of simulations to develop possible instructions for operating the real-world robotic device that corresponds to the virtual robotic device 216.

In some implementations, the virtual robotic devices 216 used within simulations may share nearly identical abstraction layers and interfaces with the physical robotic devices requesting the library for instructions and other possible information. A simulator 210 may have powerful simulations tools that enable the creation of virtual robotic devices 216 to replicate possible operations that a robotic device may execute in the real world. As such, the simulator 210 may use many virtual robotic devices 216 and may update possible virtual robotic devices 216 available by adjusting components, configurations, sizes, weights, and other possible parameters.

As an example, the simulator 210 may use a first virtual robotic device 216 having four legs within simulations and may use a second virtual robotic device 216 having two legs within other simulations. In some instances, the simulator 210 may use multiple virtual robotic devices 216 within a simulation. This may enable the simulator 210 to simulate interactions that may occur in one or more multiple robotic device scenarios. Further, the simulator 210 may adjust the first and second virtual robotic devices 216 across different simulations to determine operation instructions 208 for additional robotic devices with slightly different configurations.

The simulator 210 may use one or more virtual environment(s) 218 for performing simulations. The simulator 210 may configure a virtual environment 218 to mirror the environment of physical robotic device. Further, the simulator 210 may adjust virtual environments 218 to enable simulating virtual robotic devices 216 across any possible environment that a robotic device may encounter in the real world.

Additionally, a virtual environment 218 may include one or more objects or items that may exist within the real-world. In some simulations, the simulator 210 may remove objects from an environment across one or more simulations. The simulator 210 may also use one or more virtual environments 218 that may focus upon specific objects.

The physics engine 220 may subject the various virtual robotic device(s) 216 to different forces in virtual environment(s) 218. The physics engine 220 may exist as computer software that may provide an approximate simulation of certain physical systems, such as rigid body dynamics (including collision detection), soft body dynamics, and fluid dynamics. The term physics engine may refer to any software system for simulating physical phenomena.

The simulator 210 may include one or more physics engines 220, which may include real-time and/or high-precision physics engines. A high-precision physics engine may use processing power to calculate precise physics. A real-time physics engine may use simplified calculations and decreased accuracy to compute simulations quickly in time for a robotic device. The simulator 210 may include a combination of physics engines. Further, the system 200 may include multiple simulators 210 configured with different types of physics engines.

The physics engine 220 may be configured to apply one or more forces, including but not limited to, frictions caused by gravity, friction, or other possible forces. Further, the physics engine 220 may enable the simulator 210 to test the virtual robotic device(s) 216 performing operations in conditions identical to real-world conditions. That way, the simulator 210 may produce simulations using virtual robotic device(s) 216 that mirror physical robotic devices operating in the real world.

The simulator 210 may control parameters of the physics engine 220, which may include subjecting virtual robotic device(s) 216 to a range of conditions. In some instances, the physics engine 220 may adjust weather conditions related to one or more simulations. This way, system 200 may develop instructions to control a robotic device in multiple environments.

In some implementations, the physics engine 220 may cause different types of components having the same structure to produce different results within simulations. In particular, the physics engine 220 may simulate operations by virtual robotic devices 216 taking into account the weight of materials of components of respective virtual robotic devices 216. The physics engine 220 may cause components with different weights or weight distributions (e.g., differing center of gravity points) to behave accordingly within simulations.

In some implementations, the physics engine 220 may simulate objects, including the virtual robotic device(s), interacting within the environment. The simulation may include collision detection occurring between objects, virtual robotic devices, and the environment. The physics engine 220 may utilize a constant Brownian motion jitter or may refrain from using the jitter to reduce power consumption. The physics engine 220 may use a sleep mode for objects in the environment or portions of a virtual robotic device that may not directly impact the simulation. The physics engine 220 may use rigid body dynamics, soft body physics, and fluid dynamics to simulate virtual robotic devices in virtual environments that reflect the actual parameters of a robotic device operating in a real or potential environment.

In examples, the physics engine 220 may include a physics processing unit (PPU) configured to perform processes relating to the calculations of physics. Examples of calculations involving a PPU may include rigid body dynamics, soft body dynamics, collision detection, fluid dynamics, finite element analysis, and fracturing of objects. The physics engine 220 may include one or more processors with tasks spread among the tasks. For example, the physics engine 220 may also include a General Purpose processing on Graphics Processing Unit (GPGPU). Other examples of physics engines may exist.

The simulator(s) 210 may enable the library to include information for component design evaluation purposes. The simulations using different virtual components or virtual robotic devices having various configurations may enable a rapid hardware design cycle and may also enable rapid algorithm comparison and benchmarking.

In some implementations, the library computing system 200 including the simulator(s) 210 may enable automated model identification, which may involve utilizing large-scale physical simulations of a robotic device to identify and optimize unknown physical model parameters from observed physical data sets. The library computing system 200 may use sensitivity analysis of output parameters as a function of input parameters and noise models to prioritize the model identification. Sensitivity analysis may involve leveraging simulated noise models to enable deep introspection of system performance and robustness to uncertainty. Additionally, sensitivity analysis may also enable ranking of system inputs in order of importance and impact on overall output values.

Referring back to FIG. 2A, the communication interface 212 may serve to enable communications between system 200 and other entities (e.g., robotic devices). In some examples, system 200 may use other components to carry out communications. The communication interface 212 may enable wired or wireless access by robotic devices and/or entities to communicate with system 200. Communication interface 212 may allow system 200 to operate at distances away from robotic devices and still provide simulations and/or instructions to the robotic devices. In some implementations, the communication interface 212 may allow system 200 to operate within a "cloud".

The wired connection 214 may connect one or more components of system 200 together. The wired connection 214 may include, for example, a parallel bus or a serial bus such as a Universal Serial Bus (USB). Similarly, components in system 200 may connect via one or more wireless connections. A wireless connection may include, for example, Bluetooth, IEEE 802.11, Cellular (such as GSM, CDMA, UMTS, EV-DO, WiMAX, or LTE), or Zigbee, among other possibilities.

Figure 3A:
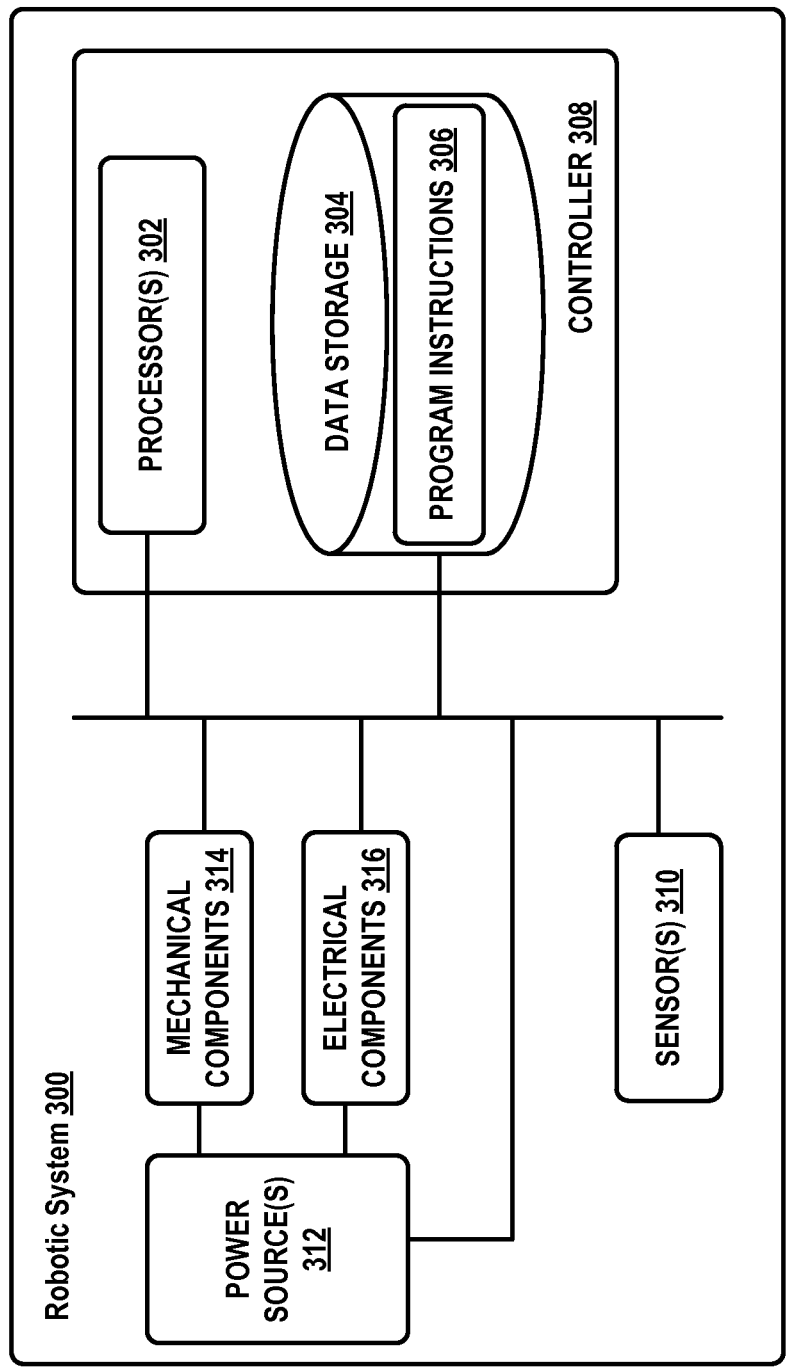
FIG. 3A illustrates an example configuration of a robotic system.

FIG. 3A illustrates an example configuration of a robotic system. Robotic system 300 represents an example robotic system configured to perform the operations described herein and may be configured to operate autonomously, semi-autonomously, and/or by providing control to user(s) through various interfaces. Also, robotic system 300 may exist in various forms, such as a humanoid robot or a quadruped robot, among other examples. Furthermore, robotic system 300 may also be referred to as a robotic device, mobile robot, or robot, etc. Robotic system 300 may also represent other types of operating entities.

As shown in FIG. 3A, robotic system 300 includes processor(s) 302, data storage 304, program instructions 306, controller 308, sensor(s) 310, power source(s) 312, mechanical components 314, and electrical components 316. Robotic system 300 is shown for illustration purposes, as robotic system 300 and may include more or less components than shown in FIG. 3. The various components of robotic system 300 may be connected in any manner, including wired or wireless connections, etc. Further, in some examples, components of robotic system 300 may be positioned on multiple entities rather on a single entity. Other example illustrations of robotic system 300 may exist as well.

Processor(s) 302 may include processors similar to processor(s) 202 of system 200 shown in FIG. 2A. Similarly, the data storage 304, program instructions 306, and controller 308 may exist according to similar components shown in FIG. 2A. These components may vary within implementations.

Additionally, robotic system 300 includes one or more sensor(s) 310 such as force sensors, proximity sensors, motion sensors, load sensors, position sensors, touch sensors, depth sensors, ultrasonic range sensors, and/or infrared sensors, among other possibilities. The sensor(s) 310 may provide sensor data to the processor(s) 302 to allow for appropriate interaction of robotic system 300 with the environment, as well as monitoring robotic system 300. The sensor data may be used in evaluation of various factors for activation and deactivation of mechanical components 314 and electrical components 316.

For instance, the sensor(s) 310 may provide information indicative of the environment of the robotic device for the controller 308 and/or computing system to use to determine operations for robotic system 300. The sensor(s) 310 may capture data corresponding to the terrain of the environment or location of nearby objects, which may assist with environment recognition and navigation, etc. In one example configuration, robotic system 300 may include a sensor system that includes RADAR, LIDAR, a global positioning system (GPS), and/or other sensors for capturing information regarding the environment of robotic system 300. The sensor(s) 310 may monitor the environment in real-time and detect obstacles, elements of the terrain, weather conditions, temperature, and/or other parameters of the environment for robotic system 300.

Further, robotic system 300 may include other sensor(s) 310 configured to receive information indicative of the state of various components of robotic system 300. The sensor(s) 310 may measure activity of systems of robotic system 300 and receive information based on the operation of the various features of robotic system 300, such the operation of extendable legs, arms, or other mechanical and/or electrical features of robotic system 300. The sensor data provided by the sensors may enable the controller 308 to determine errors in operation as well as monitor overall functioning of components of robotic system 300. For example, the controller 308 may use sensor data to determine a stability of robotic system 300 during operations, e.g., walking, running, etc., as well as measurements related to power levels, communication activities, and components that may require repair or resetting, among other information.

As one example configuration, robotic system 300 may include gyroscope(s), accelerometer(s), and/or other possible sensors to provide sensor data. As such, the gyroscope(s) may measure an orientation of robotic system 300 and the accelerometer(s) may measure proper acceleration of robotic system 300. Further, sensor(s) 310 may also monitor the current state of a function, such as a gait of robotic system 300.

In some implementations, the sensor(s) 310 may enable robotic system 300 to provide system 200 with information relating to operations of robotic system 300 and information associated with the surrounding environment. The sensor(s) 310 may monitor operations of individual components, systems, and configuration of robotic system 300, for example. Additionally, the sensor(s) 310 may enable robotic system 300 to measure and provide parameters of the environment, including location of objects, temperatures, distances, and other possible information.

Additionally, robotic system 300 may also include one or more power source(s) 312 configured to supply power to various components of the robotic system 100. Among possible power systems, robotic system 300 may include a hydraulic system, pneumatic system, electrical system, batteries, a gasoline engine, and/or other types of power systems. As an example, robotic system 300 may include one or more batteries configured to provide charge to components via a wired and/or wireless connection. Components of the mechanical components 314 and electrical components 316 may each connect to a different power source or may be powered by the same power source. Components of the robotic system 100 may connect to multiple power source(s) 312 as well.

Further, the power source(s) 312 may charge using various types of charging technology, such as wired connections to an outside power source, wireless charging, combustion, or other examples.

Mechanical components 314 represent hardware of robotic system 300 that may enable robotic system 300 to operate and perform physical functions. As a few examples, robotic system 300 may include actuator(s), extendable leg(s) ("legs"), arm(s), wheel(s), one or multiple structured bodies for housing the computing system or other components, and other mechanical components. The mechanical components 314 may depend on the design of the robotic system 100 and may also be based on the functions and/or tasks robotic system 300 may be configured to perform. In some examples, robotic system 300 may be configured to add and/or remove mechanical components 314, which may involve assistance from a user and/or other robotic device. For example, robotic system 300 may be initially configured with four legs, but may altered by a user or robotic system 300 to remove two of the four legs to operate as a biped.

The electrical components 316 may include various components capable of processing, transferring, providing electrical charge or electric signals, for example. Among possible examples, the electrical components 316 may include electrical wires, circuitry, and/or wireless communication transmitters and receivers to enable operations of the robotic system 100. The electrical components 316 may interwork with the mechanical components 314 to enable robotic system 300 to perform various functions. The electrical components 316 may be configured to provide power from the power source(s) 312 to the various mechanical components 314, for example. Further, the computing system 300 may include electric motors. Other examples of electrical components 316 may exist as well.

Figure 3B:
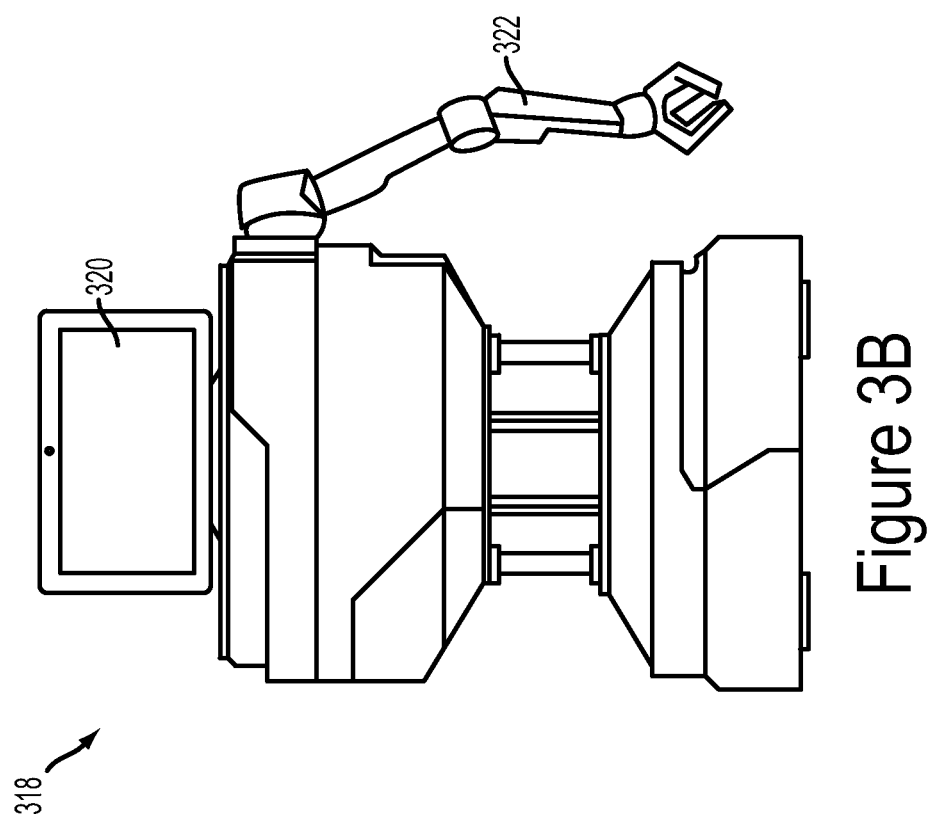
FIG. 3B shows a graphic illustration of an example robotic device.

FIG. 3B shows a graphic illustration of an example robotic device. Robotic device 318 includes an on-board computing system (e.g., device 320), mechanical actuator 322, and one or more sensors. In some cases, the on-board computing system may be a laptop computer, which may be coupled to the sensors. The sensors may include a camera, infrared projectors, and other motion sensing or vision sensing elements. The mechanical actuator 322 may include a base, wheels, and a motor upon which the on-board computing system 320 and the sensors can be positioned, for example.

Example robotic devices, such as robotic device 318 may be configured to operate according to a robot operating system (e.g., an operating system designed for specific functions of the robot). A robot operating system may provide libraries and tools (e.g., hardware abstraction, device drivers, visualizers, message-passing, package management, etc.) to enable robot applications. Examples of robot operating systems include open source software such as ROS (robot operating system), DROS, or ARCOS (advanced robotics control operating system); proprietary software such as the robotic development platform ESRP from Evolution Robotics® and MRDS (Microsoft® Robotics Developer Studio), and other examples may also include ROSJAVA. A robot operating system may include publish and subscribe functionality, and may also include functionality to control components of the robot, such as head tracking, base movement (e.g., velocity control, navigation framework), etc.

Further, example robot devices may have a link by which the link can access cloud servers (as shown in FIG. 1). A wired link may include, for example, a parallel bus or a serial bus such as a Universal Serial Bus (USB). A wireless link may include, for example, Bluetooth, IEEE 802.11, Cellular (such as GSM, CDMA, UMTS, EV-DO, WiMAX, or LTE), or Zigbee, among other possibilities.

In some examples, an example robotic device, such as robotic device 318 may be configured to receive a mobile telephone, smartphone, tablet computer, etc. to function as the "brains" or control components of the robot. The device 320 may be considered a module of the robot. The device 320 may be physically attached to the robot. For example, a smartphone may sit on a robot's "chest" and form an interactive display. The device 320 may provide a robot with sensors, a wireless link, and processing capabilities, for example, and may allow a user to download new routines for his or her robot from the cloud. For example, a laundry folding routine may be stored on the cloud, and a user may be able to select this routine using a smartphone to download the routine from the cloud, and when the smartphone is placed into or coupled to the robot, the robot would be able to perform the downloaded action.

In some examples, the robotic device 318 may be coupled to a mobile or cellular telephone to provide additional sensing capabilities. The cellular phone may not be physically attached to the robot, but may be coupled to the robot wirelessly. For example, a low cost robot may omit a direct connection to the internet. This robot may be able to connect to a user's cellular phone via a wireless technology (e.g., Bluetooth) to be able to access the internet. The robot may be able to access various sensors and communication means of the cellular phone. The robot may not need as many sensors to be physically provided on the robot, however, the robot may be able to keep the same or similar functionality.

Thus, robotic device 318 may include mechanical robot features, and may be configured to receive the device 320 (e.g., a mobile phone, smartphone, tablet computer, etc.), which can provide additional peripheral components to the device 320, such as any of an accelerometer, gyroscope, compass, GPS, camera, WiFi connection, a touch screen, etc., that are included within the device 320.

Figure 4:
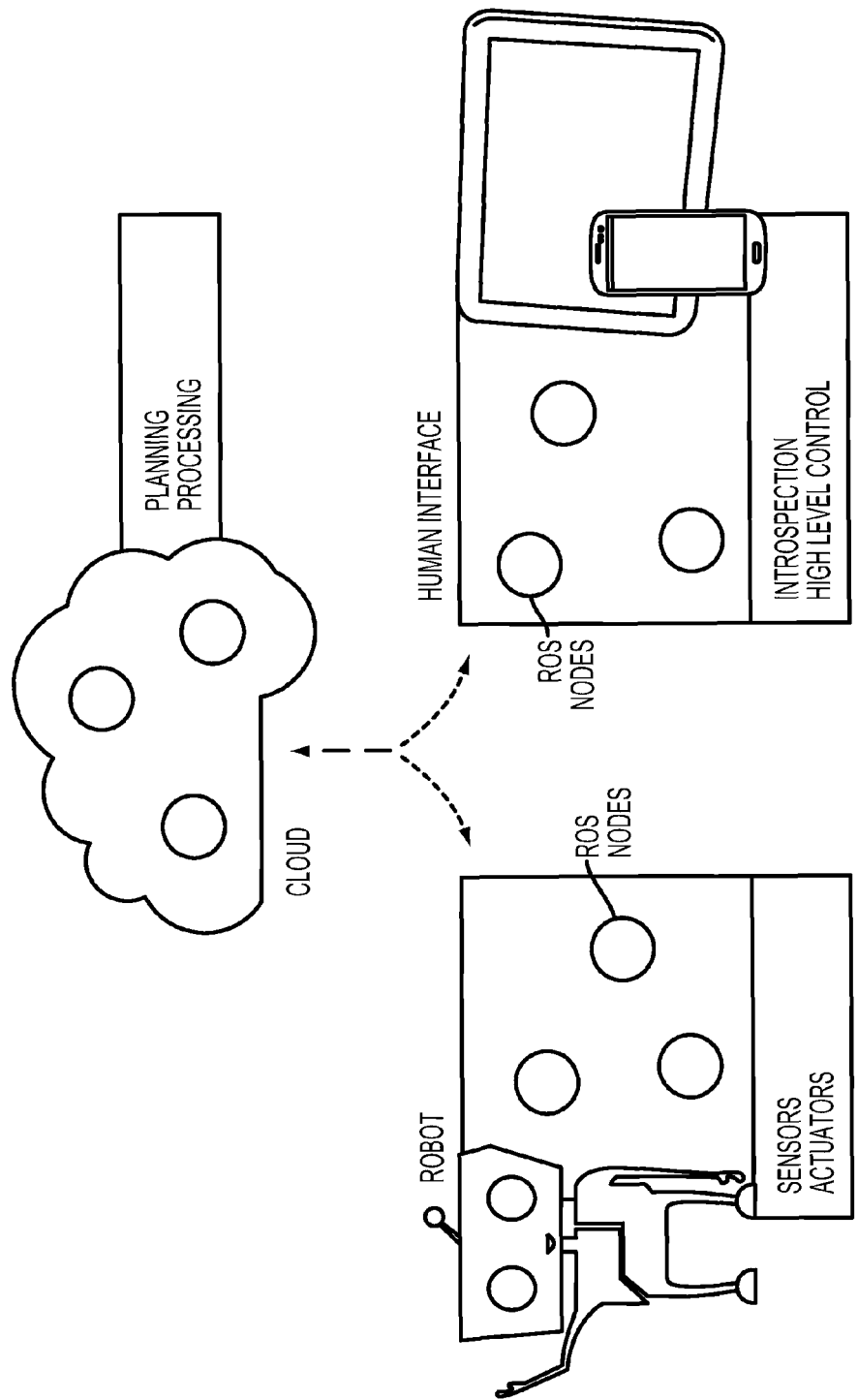
FIG. 4 illustrates an example of a conceptual robot-cloud interaction.

FIG. 4 illustrates an example of a conceptual robot-cloud interaction. A robotic device, such as robotic device 318 described and illustrated in FIG. 3B, may connect to a network of computers (e.g., the cloud), and may request data or processing to be performed by the cloud. Outputs of robotic sensors, such as camera feeds, vision sensors, etc., may be provided to the cloud, which can process the outputs to enable the robotic to perform operations. The cloud may process a camera feed, for example, to determine a location of a robotic device, perform object recognition, or to indicate a navigation pathway for the robot.

As shown, any of the modules or robotic devices may be interconnected, and/or may communicate to receive data or instructions from each other so as to provide a specific output or functionality for the robot. The robotic device may send data to a cloud, such as a robotic component library, for data processing, and the robotic device may also receive data from the cloud. The data received from the cloud may be in many different forms. The received data may be a processed form of data the robot sent to the cloud. The received data may also come from sources other than the robot. For example, the cloud may have access to other sensors, other robots, and the Internet.

Figure 5:
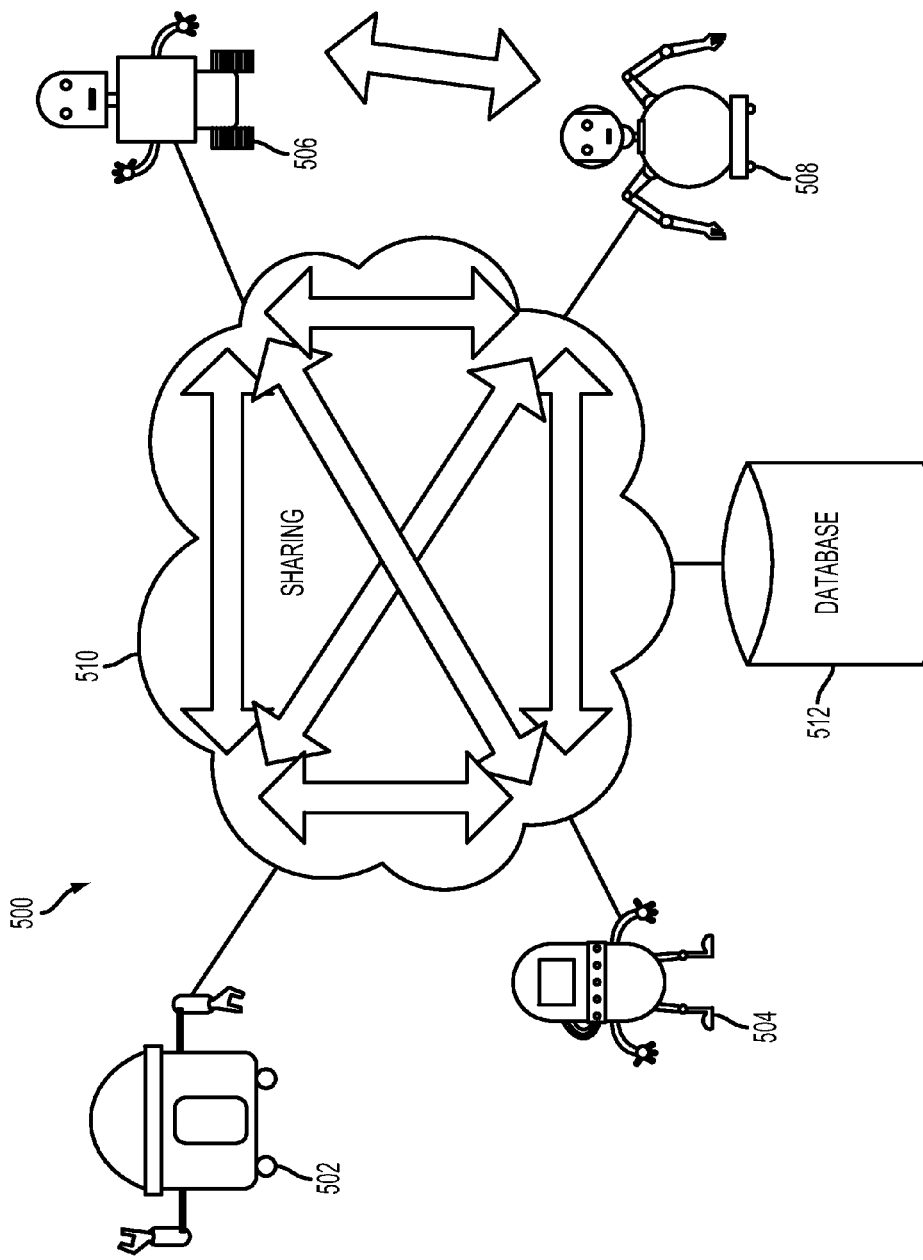
FIG. 5 illustrates an example system in which robots may interact with the cloud and share information with other cloud computing devices.

FIG. 5 illustrates an example system in which robots may interact with the cloud and share information with other cloud computing devices. The system 500 illustrates robots 502, 504, 506, and 508 (e.g., as conceptual graphical representations) communicating with a cloud 510, which may correspond to a library maintaining sets of operation instructions and/or simulation information. Each robotic device 502-508 may interact with the cloud 510, and may further interact with each other through the cloud 510, or through other access points and possibly directly (e.g., as shown between robotic devices 506-508).

The cloud 510 may receive inputs from several robotic devices, which may be complied into a larger data set. For example, the robotic device 502 may take a picture of an object and upload the picture to the cloud 510. An object recognition program on the cloud 510 may be configured to identify the object in the picture and provide data about the recognized object to all the robots connected to the cloud 510, as well as possibly about other characteristics (e.g., metadata) of the recognized object, such as a location, size, weight, color, etc. Thus, every robot may be able to know attributes of an object in a photo uploaded by the robot 502.

Similarly, the robotic device 502 may perform operations related to a task and provide the results of the operations to the cloud 510.

The robotic devices 502-508 may perform any number of actions within an area, with people, with other robots, etc. In an example, each robotic devices 502-508 has Wi-Fi or another network based connectivity and will upload/publish data to the cloud 510 that can then be shared with any other robot. In this manner, the robotic devices 502-508 may share experiences with each other to enable learned behaviors. For example, the robotic device 502 may traverse a pathway and encounter an obstacle, and can inform the other robotic devices 504-508 (through the cloud 510) of a location of the obstacle. Each robotic device 502-508 may have access to real-time up to date data. In another example, the robotic device 504 can download data indicating images seen by the other robotic device 502 and robotic devices 506-508 to help the robotic 504 identify an object using various views (e.g., in instances in which the robotic device 502 and robotic device 506-508 have captured images of the objects from a different perspective).

Overall, the robotic devices 502-508 may be configured to share data that is collected to enable faster adaptation, such that the robotic devices 502-508 can build upon a learned experience of a previous robot. Sharing and adaptation capabilities enable a variety of applications based on a variety of inputs/data received from the robotic devices 502-508.

In implementations, the cloud 510 may include, store, or provide access to a database 512 of information related to objects, and the database 512 may be accessible by all the robotic devices 502-508. The database 512 may include information identifying objects, and details of the objects (e.g., mass, properties, shape, instructions for use, etc., any detail that may be associated with the object) that can be accessed to perform object recognition. As an example, information regarding use of an object can include, e.g., for a phone, how to pick up a handset, how to answer the phone, location of buttons, how to dial, etc.

In addition, the database 512 may include information about objects that can be used to distinguish objects. For example, the database 512 may include general information regarding an object (e.g., such as a computer), and additionally, information regarding a specific computer (e.g., a model number, details or technical specifications of a specific model, etc.). Each object may include information in the database 512 including an object name, object details, object distinguishing characteristics, etc., or a tuple space for objects that can be accessed. Each object may further include information in the database in an ordered list, for example. In further examples, the database 512 may include a global unique identifier (GUID) for objects identified in the database 512 (e.g., to enable distinguishing between specific objects), and the GUID may be associated with any characteristics or information describing the object. Thus, a robotic device may be configured to access the database 512 to receive information generally distinguishing objects (e.g., a baseball vs. a computer), and to receive information that may distinguish between specific objects (e.g., two different computers).

The database 512 may be accessible by all robots through the cloud 510 (or alternatively directly accessible by all robots without communication through the cloud 510). The database 512 may thus be a shared knowledge-base stored in the cloud 510.

Thus, in some examples, robots may share learned behaviors through the cloud 510. The cloud 510 may have a server that stores robot learned activities or behaviors resulting in a shared knowledge-base of behaviors and heuristics for object interactions (e.g., a robot "app store"). Specifically, a given robot may perform actions and build a map of an area, and then the robot can upload the data to the cloud 510 to share this knowledge with all other robots. In this example, a transportation of the given robot's "consciousness" can be made through the cloud 510 from one robot to another (e.g., robot "Bob" builds a map, and the knowledge of "Bob" can be downloaded onto another robot to receive knowledge of the map).

Thus, within examples, the robotic devices 502-508 may share information through the cloud 510, and may access the database 512. For example, the robotic devices 502-508 may help further develop simulations and instruction for performing operations within the library. The computing system may use information received from the robotic devices 502-508 to further develop operation instructions and refine unsuccessful instructions. The computing system may optimize the instructions stored within the library.

Figure 6:
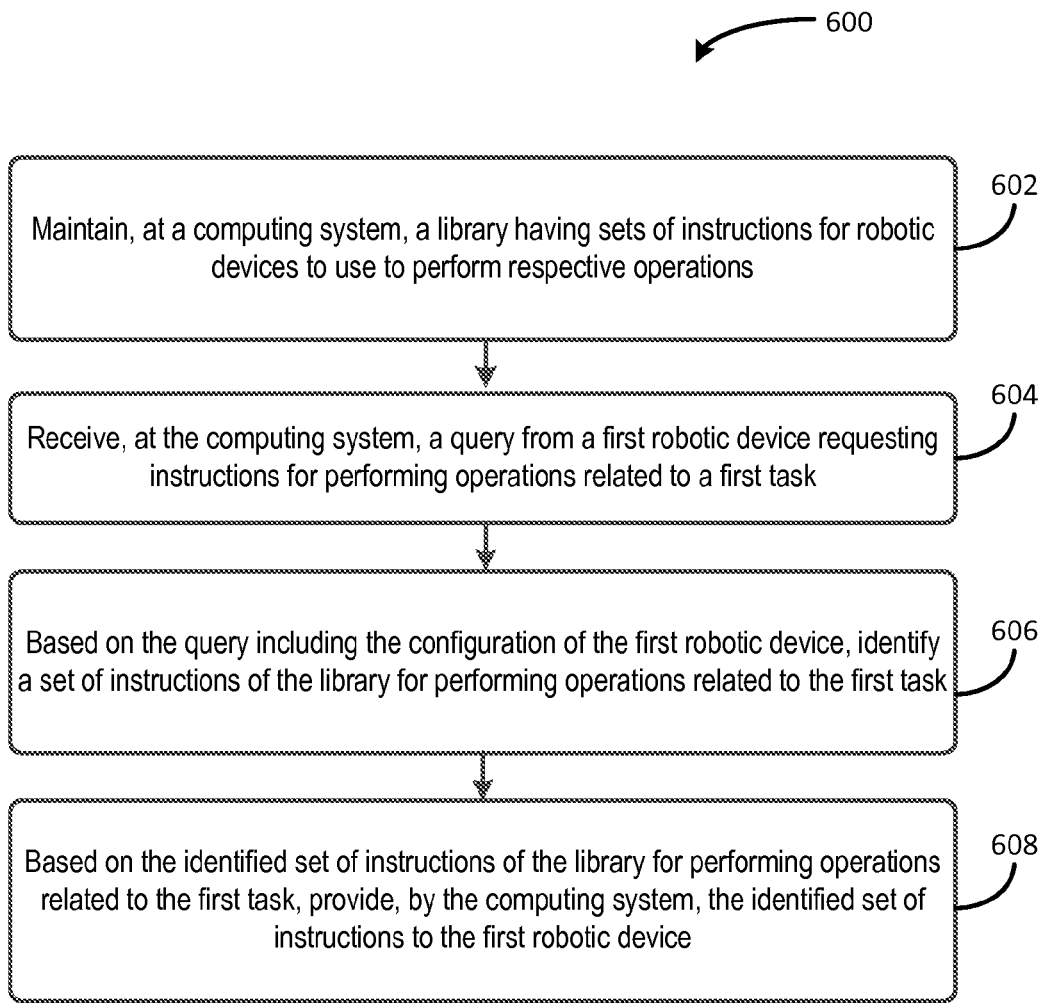
FIG. 6 is a flowchart for implementing robotic operation libraries, according to an example implementation.

FIG. 6 is a flowchart for implementing robotic operation libraries, according to an example implementation. The method 600 may include one or more operations, functions, or actions as illustrated by one or more blocks 602-608. Although the blocks are illustrated in a sequential order, these blocks may, in some instances, be performed in parallel, and/or in a different order than those described herein. Also, the various blocks may be combined into fewer blocks, divided into additional blocks, and/or removed based upon the desired implementation.

In addition, for the method 600 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium or memory, for example, such as a storage device including a disk or hard drive.

The computer readable medium may include a non-transitory computer readable medium, for example, such as computer-readable media that stores data for short periods of time like register memory, processor cache and Random Access Memory (RAM). The computer readable medium may also include non-transitory media or memory, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, a tangible storage device, or other article of manufacture, for example.

The non-transitory computer readable medium could also be distributed among multiple data storage elements, which could be remotely located from each other. Alternatively, the computing device or system that executes some or all of the stored instructions could be another computing device or system, such as a server.

In addition, for the method 600 and other processes and methods disclosed herein, each block in FIG. 6 may represent circuitry that is wired to perform the specific logical functions in the process. Example methods, such as method 600 of FIG. 6 may be carried out in whole or in part by a system (e.g., system 200) and/or multiple systems. Accordingly, example methods could be described by way of example herein as being implemented by a server, a computing system, or a network of computing systems. However, it should be understood that an example method may be implemented in whole or in part by other computing devices or separate from the computing system. For example, an example method may be implemented in whole or in part by a server system, which receives data from a device such as those associated with the robotic device.

At block 602, the method 600 may include maintaining, at a computing system, a library having sets of instructions for robotic devices to use to perform respective operations. The computing system maintaining and operating the library, also described herein as the library computing system, may include one or multiple computing devices, a network of computing systems, servers, and/or other computing devices. For example, a system, such as system 200 shown in FIG. 2A, may operate the library as a cloud enterprise that may enable computing devices, robotic devices, and/or other possible entities access information from the library. Other examples of library computing systems may exist.

In some implementations, the library computing system may monitor access to the library, including limiting or permitting access to particular robotic devices based on bandwidth, security reasons, and/or economic parameters, etc. For example, the computing system may limit access to robotic devices satisfying a payment plan.

The configuration and organization of the library may vary, which may include having sets of instructions organized based on configurations of components or robotic devices. Divisions of the library may store instructions that correspond to respective configurations of robotic devices since types of robotic devices may operate differently. As an example, the library may include a first division of instruction sets directed towards robotic devices with four legs and a second division of instruction sets directed towards biped robotic devices.

Additionally, the library may include more subdivisions within divisions of the library. For example, the initial divisions may organize sets of instructions based on general configurations of the robotic devices (e.g., wheels or legs) and subdivisions may further refine the organization of instructions to correspond to more particular configurations of the robotic device. The quadruped set of instructions may further be organized based on the type of legs, configuration of the robotic device, and/or other differences possible among quadruped robotic devices.

Furthermore, the library may include sets of instructions corresponding to respective components of robotic devices, which may enable a user or robotic device to evaluate potential component designs. The component libraries may enable the interchange and adjustment of robotic configurations without physically having to test or reprogram the new configuration.

Additionally, the library may include other information, such as maps, simulations, communication protocols, and/or other information to provide to robotic devices. In some implementations, the library computing system may also receive information, such as results from executing operations, from robotic devices and/or other entities to further develop the library.

As indicated, a given set of instructions stored in the library may enable a robotic device having a given configuration perform respective operations related to completing a task. As such, the library computing system may focus on a subdivision of the library that stores instructions applicable to robotic devices with the particular configuration upon receiving a request from a robotic device with the particular configuration. The library computing system may use the subdivision as a starting point to locate instructions or information that the robotic device may use.

Further, as previously described herein, the library computing system may develop sets of operation instructions based on one or more simulations using virtual robotic devices having various configurations to test the success of operations in various virtual environments. The library computing system may develop a set of operation instructions based on a simulation showing that the virtual robotic device successfully performs an operation related to completing a task above a predefined threshold. The predefined threshold may vary within examples and may exist as a predefined range of percentages for successful completion of the task, for example.

The simulations may involve the virtual robotic device having a configuration that is initially based on a given configuration of the robotic device and adjusting the configuration to further develop the instructions for robotic devices with similar configurations. Based on the results of a simulation, the simulator may adjust parameter(s) of the simulation in attempts to improve the operations of the virtual robotic device. The adjustments may include one or more adjustments to the virtual robotic device, the operations performed by the virtual robotic device, and/or the environment. For example, the simulator may adjust operations or the configuration of the virtual robotic device. Depending if the adjustments improved or worsened the outcomes of the simulation, the simulator may make further adjustments.

In some examples, the library computing system may continuously run simulations for all types of components. As such, for a given component or configuration of robotic device, the simulator may run multiple simulations adjusting the operations and environment. The library computing system may develop instructions for operations that a given component may execute in different types of environments.

As another example, the library computing system may develop sets of instructions for a type of mechanical gripper. As such, the library may store instructions for performing an operation when the mechanical gripper is created in metal and then another set of instructions for performing the same or similar operation when the mechanical gripper exists in a different material (e.g., a plastic). The library computing system may develop instructions for operating the mechanical gripper when the mechanical gripper is different sizes, within different environments, attached at various points to a robotic device, and other possible variations.

As shown, the library computing system may store instructions for different types of robotic devices and include further instructions directed towards different configurations of the robotic devices. In some instances, the library computing system may further simulate changes involving a robotic device attempting to operate using a new configuration. For example, the library may include respective sets of instructions for a given configuration of a robotic device and may also include other sets of instructions for the same robotic device with a different mechanical gripper added onto the robotic device. Other instructions may correspond to operations that enable robotic devices operating with different changes in configurations, such as changes in the size, materials, structure, or other changes to a robotic device.

The library computing system may also store and provide instructions for robotic devices to use to execute similar operations within different environments. For example, the library may include operation instructions developed for a particular configuration of robotic device to perform to complete a given task when the temperature is above a certain threshold and another set of instructions for performing similar operations to complete the given task when the temperature of the environment of the robotic device is below the threshold. The environment of a robotic device may influence the outcome of operations and the library computing system may develop multiple sets of instructions for completing a task using similar operations that vary based on changes in the environment. This may include changes to forces applied to robotic devices as well as different positions or orientations of objects within the environment relative to the robotic device.

At block 604, the method 600 may include receiving, at the computing system, a query from a first robotic device requesting instructions for performing operations related to a first task. The library computing system may receive queries from robotic devices that request information, such as instructions for performing operations related to a task, from the library. The library computing system may receive the requests, such as queries, through a wired or wireless connection, for example.

As a robotic device operates, the robotic device may be configured to perform tasks, which may include travel, manipulating objects, and/or other tasks. In some instances, the computing system controlling the robotic device may enter a robot meditation during which the robotic device send a request to the library for operations instructions related to a current task.

In some implementations, the computing system may receive one or more queries from a robotic device that includes information indicative of a configuration and an environment of the robotic device. The library computing system may be configured to process multiple requests from one or more robotic devices at a given time. The library computing system may receive information within a request provided by a robotic device, including location information, environment information, configuration and operation information, etc.

At block 606, the method may include, based on the query including the configuration of the first robotic device, identifying a set of instructions of the library for performing operations related to the first task. Upon receiving a query from a robotic device requesting information (e.g., operation instructions), the library computing system may process the query to identify information to provide to the robotic device in response.

As indicated, the robotic query received by the library computing system may likely include information that may assist in the search for operation instructions. In particular, the query provided by the robotic device may indicate a desired task and information associated with the configuration of the robotic device and the surrounding environment of the robotic device. The library computing system may use the information to identify one or more sets of instructions that may enable the particular robotic device to successfully complete the desired task in the given environment.

In some instances, the query received by the library computing system may include additional information relating to the robotic device, which may include an amount of power available to perform operations or time constraints associated with completing the desired task. A portion or all the information received from a robotic device requesting operation instructions may assist the library computing system process the current situation of the robotic device and select proper operation instructions that may likely enable the robotic device to use to complete the task. The library computing system may analyze the incoming information provided by the robotic device to identify operation instructions that likely enable the robotic device to complete a desired task.

The library computing system may be configured to search available sets of instructions. For example, the library computing system may first search the sets of instructions based on the desired task of the robotic device and the configuration of the robotic device. The library computing system may further refine the identified sets of instructions based on the environment of the computing system or other possible parameters that may affect the results of performing operations. Other preferences and processes of searching may be used by the library computing system.

In some instances, the library computing system may identify multiple sets of instructions for performing different operations that enable a robotic device to complete a task. The library computing system may select the set of instructions with the highest rate of success, for example, or may select the set of instructions that originates from simulations using a virtual robotic device and virtual environment that most closely matches the actual configuration and environment of the robotic device.

Further, the library computing system may also use further simulations to identify which set of instructions to provide to the robotic device. The further simulations may involve using a virtual robotic device that mirrors the robotic device requesting the operation instructions and may also include the virtual robotic device in an environment and situation that mirrors the situation and environment of the robotic device. This way, the library computing system may assess possible operations for the robotic device to use to complete the task without requiring the actual robotic device to perform any simulations or physical operations. The library computing system may store the newly developed instructions for later use by the same or other robotic devices with similar configurations.

In additional implementations, the library computing system may identify the set or sets of operation instructions to provide to a robotic device based on the success rate associated with the information. In some instances, the computing system may compare the success rates with a threshold and not send any instructions unless the set of instructions enable the robotic device to complete the task within a success range (e.g., a 90 percent or better success rate).

Additionally, the library computing system may utilize graphical tools for previewing robotic device behaviors or may enable a computing system of a robotic device to perform similar operations. The library may enable a robotic device or user to analyze potential changes to the physical robotic device, including hardware or software changes. As such, the library computing system may provide information resulting from analyzing performance differences that may occur by changing one or more components within a robotic device. The graphical tools may assist in developing and utilizing the virtual robotic devices, virtual environments, and/or other possible parameters that contribute to simulating and developing procedures for robotic devices to use to complete tasks.

In some implementations, the library computing system may provide all or a portion of instructions applicable to a robotic device based on the configuration of the robotic device. The robotic device may use the instructions received to analyze current software to identify possible problems that the software of the robotic device may include. The robotic device may operate according to downloaded instructions when the robotic device operates.

At block 608, the method may include, based on the identified set of instructions of the library for performing operations related to the first task, providing, by the computing system, the identified set of instructions to the first robotic device. Responsive to identifying a set of instructions or multiple sets of instructions that may assist the robotic device complete a task indicated within a query, the library computing system may provide the set of instructions to the robotic device.

The library computing system may provide a series of instructions to perform multiple steps to complete a desired task. In particular, the library computing system may transmit instructions in multiple parts or may send the instructions in a single session to the robotic device.

The library computing system may provide information to the robotic devices during robotic meditation. Robotic meditation may enable a robotic device to use the library to improve performance on both specific and broad task domains by leveraging large-scale physical simulations located within the library. A given robotic device may use robot meditation to receive information from the library to execute machine learning techniques and for automatic parameter tuning and optimization, for example. Furthermore, the robotic device may improve automated behavior and execution of skills.

As an example, a robotic device may be configured to open a door by turning a door knob. Upon determining that the robotic device desires to open a particular door, the robotic computing system may provide a query to the library requesting instructions for opening the door. The query may include information indicative of the configuration of the robotic device as well as information indicating the position, size, orientation, location, and/or parameters associated with the door and the door knob. Prior to attempting to open the door, the robotic device may temporarily cease operation and provide the query during a robotic meditation state. The robot meditation may limit the power use of the robotic device and prevent the robotic device from performing any unwanted operations until receiving instructions from the library. The robotic device may receive instructions for opening the particular from the library during the meditation process.

Further, the library computing system may provide information to robotic devices to enable machine learning to optimize both task-specific heuristics and behavior selection and discovery of the robotic devices. Machine learning may involve training computing systems of robotic devices to act without requiring explicit programming. In some instances, the machine learning may enable the robotic devices to learn through focusing on prediction, based on known properties learned from training data. Thus, the robotic device may use information from the library to improve behavior selection and discovery, which may be in addition to improving skills for executing task-specific operations.

In another example, the library computing system may receive a query from a robotic device to enter a room and pick up an object. The library computing system may identify instructions that enable the robotic device to enter the room and another set of instructions that provide operations for picking up the object. Responsive to identifying the different instructions, the computing system may modify the instructions together prior to sending the modified instructions to the robotic device to process and use. The robotic device may efficiently use the modified instructions to perform the multiple operations to complete the task.

Further, the library computing system may receive a query from one or more additional robotic devices requesting instructions for performing operations related to a task. For example, the library computing system may receive a query from a second robotic device requesting instructions for performing operations related to a second task, which may be similar to the first task in some instances. The configuration of the second robotic device may differ from the configuration of the first robotic device. The library computing system may determine whether identified set of instructions of library for executing operations related to the first task enables the second robotic device to complete the second task. The library computing system may provide the instructions based on determining that the instructions enable the second robotic device to complete the second task or may identify new instructions in response to determining that the prior instructions does not enable the second robotic device to complete the second task.

In some instances, the library computing system may execute additional simulations, which may involve executing simulations using a virtual robotic device configured based on a second robotic device. The library computing system may identify instructions of the library based on parameters of the environment of the robotic device.

In a further implementation, the library computing system may also update respective instructions in response to receiving operation results from robotic devices. The library may update periodically or continuously using information received from new simulations or provided by robotic devices. For example, a robotic device may fail to complete a task despite using instructions provided by the library, and may signal the failure to the library system. The library computing system modify the library based on the results and may also send other instructions to the robotic device based on the results. The library computing system may refine the library to remove instructions that may not enable success.

In another implementation, robotic devices may automatically tune operation parameters (e.g., calibrate components) using library information. The library instructions may enable a given robotic device update operations to improve efficiency and safety. The library computing system may enable a robotic device to develop and improve skills. In some instances, the robotic device may also perform simulations to access possible operations, which may involve performing the simulations using instructions provided by the library computing system.

In another example implementation, the library computing system may receive a travel request from a quadruped robotic device. The travel request may include information relating to the robotic device configuration, environment, desired travel task (i.e., travel across the room), and other possible information. The computing system may process the information to identify set(s) of instructions for the quadruped robotic device to use to travel according to the desired task.

In another example implementation, the library computing system may receive a query from a robotic device requesting instructions for manipulating an object (e.g., grab a particular object). The library computing system may process the query to discover that the robotic device includes multiple available grippers and may search the stored instructions within the library system to identify instructions that may be used by the grippers of the robotic device. In the case that the robotic device identifies multiple sets of instructions, the computing system may select a set of instructions to provide the robotic device based on a success rating (e.g., highest success rate) or another parameter.

In a further example, the library may include instructions for operating a particular type of mechanical gripper. A series of simulations may have focused on a virtual mechanical gripper mirroring the mechanical gripper performing a range of operations across the simulations to determine the successful and unsuccessful operations for the mechanical gripper. Some simulations may indicate that the mechanical gripper can manipulate objects within a range of sizes and other simulations may reflect limitations. The library computing system may include a subdivision of instructions developed based on the successful simulations.

In some implementations, the library computing system may also enable online feed-forward control and planning for robotic devices. For example, a robotic device may access information for walking, balance control, and whole-body trajectory generation in the library.

Further, the library may enable a robotic device to use real-time feed-forward simulation to construct the near-time horizon motion trajectory tree to better predict potential failures (e.g., obstacle collisions). The robotic device may use information within the library for proactive computation of contingency plans and trajectories in response to potential failures. As such, a robotic device may run online feed-forward control and planning processes onboard the robotic device within a real-time loop. This may include efficient performance in terms of CPU and memory usage of the robotic device as well optimizing for speed and robustness.

Figure 7:
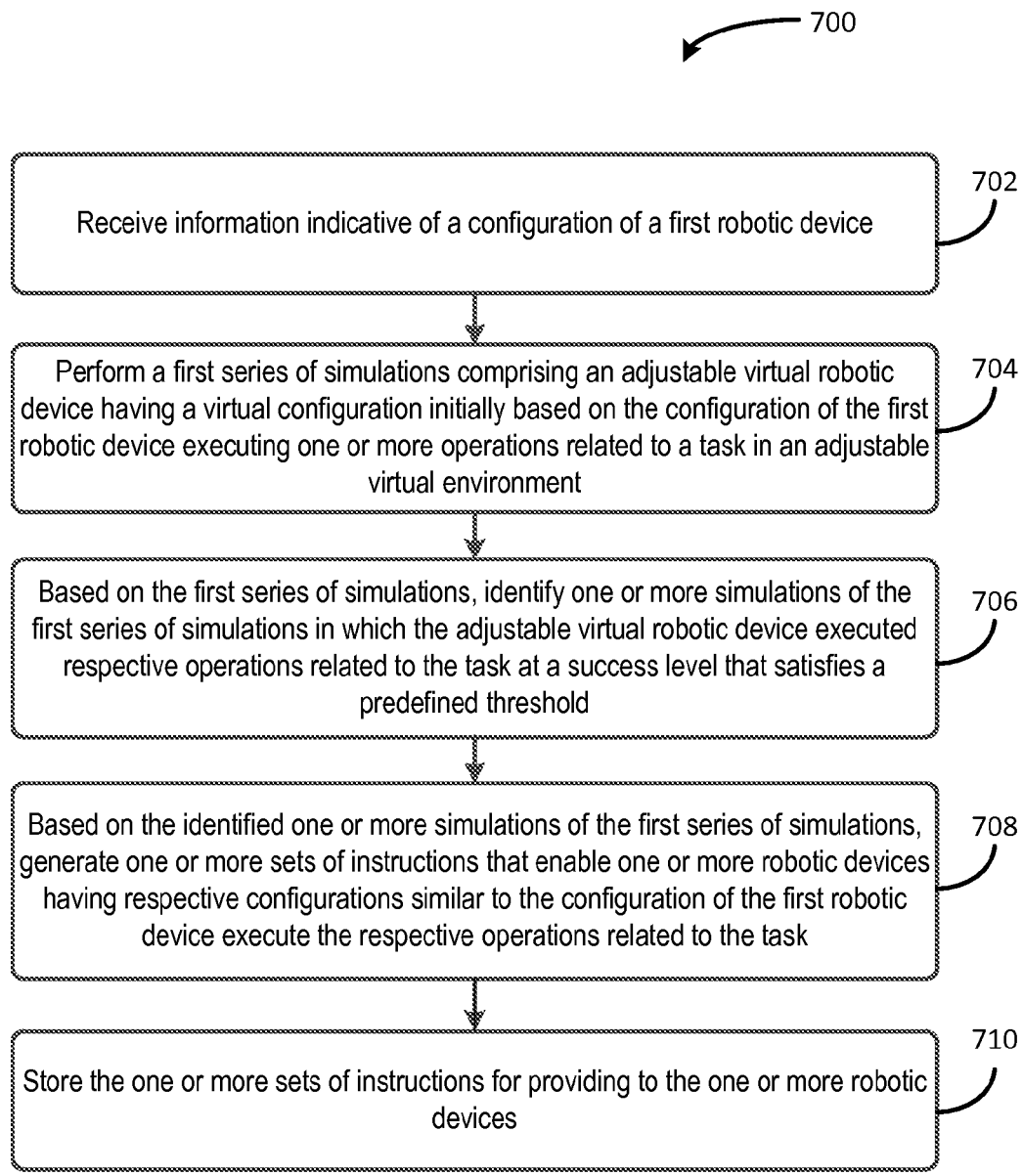
FIG. 7 is another example flowchart for implementing robotic operation libraries.

FIG. 7 is another example flowchart for implementing robotic operation libraries. The method 700 may include one or more operations, functions, or actions as illustrated by one or more blocks 702-710. Although the blocks are illustrated in a sequential order, these blocks may, in some instances, be performed in parallel, and/or in a different order than those described herein. Also, the various blocks may be combined into fewer blocks, divided into additional blocks, and/or removed based upon the desired implementation.

At block 702, the method may include receiving information indicative of a configuration of a first robotic device. The information may relate to parameters associated with the robotic device, such as structure, position, orientation, and/or assembly information. Further, in some instances, the information may be indicative of a single robotic component or multiple robotic components rather than an entire robotic device. For example, the components may be assembled as a portion of a robotic device.

The library computing system may cycle through different components for receiving information and developing instructions to use for operating the components. For example, the library computing system may receive information associated with a first mechanical gripper and develop instructions for the first mechanical gripper based on the configuration information. Additionally, the library computing system may perform similar processes for additional mechanical grippers that may have variations in configuration, structure, and/or other parameters.

At block 704, the method may include performing a first series of simulations comprising an adjustable virtual robotic device having a virtual configuration initially based on the configuration of the first robotic device executing one or more operations related to a task in an adjustable virtual environment. In some instances, successive simulations in the first series of simulations differ based on one or more adjustments to the virtual configuration of the adjustable virtual robotic device, the one or more operations, and the adjustable virtual environment. The library computing system may perform one or more series of simulations to develop instructions for a given configuration of a robotic device or component within different environments.

As previously described herein, the virtual robotic device may adjust configuration or operations based on desires of the library computing system. For example, the simulations may involve changes to any number of the parameters of the virtual robotic device. Similarly, in some simulations, multiple virtual robotic devices may be used.

In some implementations, one or more respective adjustments to one or more of the structure, material, and size of the virtual configuration of the adjustable virtual robotic device. Further, in other implementations, respective adjustments to one or more parameters associated with the adjustable virtual environment. For example, the one or more parameters may include forces, positions of objects, temperature, and weather associated with the adjustable virtual environment.

The virtual robotic devices may vary based on type of robotic device or component(s) being simulated. As such, the library computing system may receive simulations based on a variety of robotic components and/or robotic devices.

At block 706, the method may include based on the first series of simulations, identifying one or more simulations of the first series of simulations in which the adjustable virtual robotic device executed respective operations related to the task at a success level that satisfies a predefined threshold. The library computing system and/or another computing system may analyze the simulations to determine simulations that result in the virtual robotic device(s) or virtual robotic component(s) performing one or more operations related to a task within a predefined range of success or similar confident measurement. The predefined threshold may specify a percentage range of success and/or other particular parameters for determining successful operations that may likely enable a robotic device to perform the operations successfully. The series of simulations may enable the simulators to refine the simulations until determining particular operations that may enable successful execution by a given robotic device configuration.

At block 708, the method may include, based on the identified one or more simulations of the first series of simulations, generating one or more sets of instructions that enable one or more robotic devices having respective configurations similar to the configuration of the first robotic device execute the respective operations related to the task. The library computing system may develop one or more sets of instructions for performing operations related to a task determined and refined during each respective series of simulations. The sets of instructions may enable particular robotic devices having a given configuration or may enable a larger range of robotic devices perform the respective operations related to a task. For a variety of tasks, the library computing system may develop instructions for performing operations for completing a given task that may correspond to a particular configuration of robotic device.

At block 710, the method may include storing the one or more sets of instructions for providing to the one or more robotic devices. As indicated, the library computing system may develop the library by storing instructions for a variety of robotic device configurations to perform different operations related to various tasks. The library may operate within a cloud on one or more computing devices, for example. Further, the library computing system may store the instructions and/or other information within various types of memory.

In some implementations, the library computing system may perform a second series of simulations comprising the adjustable virtual robotic device having the virtual configuration initially based on the configuration of the first robotic device executing one or more operations related to a second task in the adjustable virtual environment. Further, the library computing system or another computing system may, based on the second series of simulations, identify one or more simulations of the second series of simulations in which the adjustable virtual robotic device executed respective operations related to the second task at a given success measure above the threshold. The library computing system may also generate one or more additional sets of instructions based on the identified one or more simulations of the second series of simulations that enable the plurality of robotic devices to execute the respective operations related to the second task and may store the one or more additional sets of instructions for providing to the one or more robotic devices.

In some implementations, the library computing system may also receive information indicative of a configuration of a second robotic device and perform a given series of simulations comprising the adjustable virtual robotic device having the virtual configuration initially based on the configuration of the second robotic device executing one or more operations related to a given task in the adjustable virtual environment. The library computing system may identify one or more simulations of the given series of simulations based on the given series of simulations in which the adjustable virtual robotic device executed respective operations related to the given task at a respective success level that satisfies the predefined threshold.

The library computing system may also, based on the identified one or more simulations of the given series of simulations, generate one or more sets of instructions that enable one or more robotic devices having respective configurations similar to the configuration of the second robotic device execute the respective operations related to the task. Further, the library computing system may store the one or more sets of instructions for providing to the one or more robotic devices. Other processes may be used to develop instructions for providing robotic devices as well.

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A method comprising:

maintaining, at a computing system, a library having sets of instructions for robotic devices to use to perform respective operations, wherein a given set of instructions enables a robotic device having a given configuration to perform respective operations related to completing a task, and wherein the given set of instructions is determined based on a set of successive simulations in which a virtual robotic device comprising an adjustable configuration initially based on the given configuration of the robotic device performs a plurality of operations related to the task in an adjustable virtual environment until one or more simulations of the set of successive simulations results in the virtual robotic device performing respective operations that complete the task at a success level that satisfies a predefined threshold;

receiving, at the computing system, a query from a first robotic device requesting instructions for performing operations related to a first task, wherein the query includes information indicative of a configuration and an environment of the first robotic device;

based on the query including the configuration of the first robotic device, identifying a set of instructions of the library for performing operations related to the first task; and based on the identified set of instructions of the library for performing operations related to the first task, providing, by the computing system, the identified set of instructions to the first robotic device.

2. The method of claim 1, wherein the library having the sets of instructions for robotic devices to use to perform respective operations comprises:

respective sets of instructions for one or more configurations of a plurality of different types of robotic devices to use to perform respective operations.

3. The method of claim 1, wherein consecutive simulations in the set of successive simulations in which the virtual robotic device comprising the adjustable configuration initially based on the given configuration of the robotic device performs the plurality of operations related to the task in the adjustable virtual environment comprise:

one or more adjustments to the adjustable configuration, the plurality of operations related to the task, and the adjustable virtual environment.

4. The method of claim 1, wherein based on the query including the configuration of the first robotic device, identifying the set of instructions of the library for performing operations related to the first task further comprises:

performing one or more simulations using the virtual robotic device in which the adjustable configuration of the virtual robotic device corresponds to the configuration of the first robotic device, wherein the simulation includes the virtual robotic device using one or more sets of instructions of the library related to the task in a virtual environment that corresponds to the environment of the first robotic device; and based on results of the one or more simulations, identifying the set of instructions of the one or more sets of instructions of the library for performing operations related to the first task.

5. The method of claim 1, wherein based on the query including the configuration of the first robotic device, identifying the set of instructions of the library for performing operations related to the first task comprises:

selecting one or more sets of instructions of the library for performing operations related to the first task based on the configuration of the first robotic device; and identifying the set of instructions from the one or more selected sets of instructions of the library based on the environment of the first robotic device, wherein the set of instructions from the one or more selected sets of instructions is based on a given set of successive simulations in which the virtual robotic device comprising the adjustable configuration based on the particular configuration of the first robotic device performs a plurality of operations related to the task in a virtual environment that corresponds to the environment of the first robotic device until one or more simulations of the set of successive simulations results in the virtual robotic device performing respective operations that complete the task at a success level that satisfies the predefined threshold.

6. The method of claim 1, wherein the predefined threshold is a predefined range of percentages for successful completion of the task.

7. The method of claim 1, further comprising:

receiving results associated with the first robotic device performing the operations related to the first task based on the set of instructions of the library; and adjusting one or more sets of instructions of the library based on the results.

8. A system comprising:

at least one processor; and a memory having stored thereon executable instructions that, upon execution by the at least one processor, cause the system to perform functions comprising:

maintaining a library having sets of instructions for robotic devices to use to perform respective operations, wherein a given set of instructions enables a robotic device having a given configuration to perform respective operations related to completing a task, and wherein the given set of instructions is determined based on a set of successive simulations in which a virtual robotic device comprising an adjustable configuration initially based on the given configuration of the robotic device performs a plurality of operations related to the task in an adjustable virtual environment until one or more simulations of the set of successive simulations results in the virtual robotic device performing respective operations that complete the task at a success level that satisfies a predefined threshold;

receiving a query from a first robotic device requesting instructions for performing operations related to a first task, wherein the query includes information indicative of a configuration and an environment of the first robotic device;

based on the query including the configuration of the first robotic device, identifying a set of instructions of the library for performing operations related to the first task; and based on the identified set of instructions of the library for performing operations related to the first task, providing the identified set of instructions to the first robotic device.

9. The system of claim 8, further comprising:

receiving a given query from a second robotic device requesting instructions for performing operations related to a second task, wherein the query includes information indicative of a configuration and an environment of the second robotic device, and wherein the second task is similar to the first task and the configuration of the second robotic device differs from the configuration of the first robotic device;

determining whether the identified set of instructions of the library for performing operations related to the first task enables the second robotic device to complete the second task; and based on determining that the identified set of instructions enables the second robotic device to complete the second task, providing the identified set of instructions to the second robotic device.

10. The system of claim 8, further comprising:

receiving a given query from a second robotic device requesting instructions for performing operations related to a second task, wherein the query includes information indicative of a configuration and an environment of the second robotic device, and wherein the second task is similar to the first task and the configuration of the second robotic device differs from the configuration of the first robotic device;

determining whether the identified set of instructions of the library for performing operations related to the first task enables the second robotic device to complete the second task;

based on determining that the identified set of instructions fails to enable the second robotic device to complete the second task, identifying a second set of instructions of the library for performing operations related to the second task; and based on the identified second set of instructions of the library for performing operations related to the first task, providing the identified second set of instructions to the second robotic device.

11. The system of claim 10, wherein determining whether the identified set of instructions enables the second robotic device complete the second task comprises:

performing a given simulation in which the virtual robotic device executes respective operations of the identified set of instruction related to the second task, wherein the adjustable configuration of the virtual robotic device corresponds to the configuration of the second robotic device; and based on results of the given simulation, determining whether the identified set of instructions enables the second robotic device complete the second task.

12. The system of claim 8, wherein providing the identified set of instructions to the first robotic device includes:

providing respective simulations that correspond to the identified set of instructions in addition to the identified set of instructions to the first robotic device.

13. The system of claim 8, wherein based on the query including the configuration of the first robotic device, identifying the set of instructions of the library for performing operations related to the first task comprises:

identifying the set of instructions of the library for performing operations related to the first task is further based on one or more parameters associated with the environment of the first robotic device.

14. The system of claim 8, wherein the library operates in a cloud network.

15. A method comprising:

receiving, at a computing system, information indicative of a configuration of a first robotic device;

performing a first series of simulations comprising an adjustable virtual robotic device having a virtual configuration initially based on the configuration of the first robotic device executing one or more operations related to a task in an adjustable virtual environment, wherein successive simulations in the first series of simulations differ based on one or more adjustments to the virtual configuration of the adjustable virtual robotic device, the one or more operations, and the adjustable virtual environment;

based on the first series of simulations, identifying one or more simulations of the first series of simulations in which the adjustable virtual robotic device executed respective operations related to the task at a success level that satisfies a predefined threshold;

based on the identified one or more simulations of the first series of simulations, generating one or more sets of instructions that enable one or more robotic devices having respective configurations similar to the configuration of the first robotic device execute the respective operations related to the task; and storing, by the computing system, the one or more sets of instructions for providing to the one or more robotic devices.

16. The method of claim 15, wherein the first robotic device is a single robotic component.

17. The method of claim 15, further comprising:

performing a second series of simulations comprising the adjustable virtual robotic device having the virtual configuration initially based on the configuration of the first robotic device executing one or more operations related to a second task in the adjustable virtual environment;

based on the second series of simulations, identifying one or more simulations of the second series of simulations in which the adjustable virtual robotic device executed respective operations related to the second task at a given success measure above the threshold;

based on the identified one or more simulations of the second series of simulations, generating one or more additional sets of instructions that enable the plurality of robotic devices to execute the respective operations related to the second task; and storing, by the computing system, the one or more additional sets of instructions for providing to the one or more robotic devices.

18. The method of claim 15, wherein the one or more adjustments to the virtual configuration of the adjustable virtual robotic device, the one or more operations, and the adjustable virtual environment comprises:

respective adjustments to one or more of the structure, material, and size of the virtual configuration of the adjustable virtual robotic device.

19. The method of claim 15, wherein the one or more adjustments to the virtual configuration of the adjustable virtual robotic device, the one or more operations, and the adjustable virtual environment comprises:

respective adjustments to one or more parameters associated with the adjustable virtual environment, wherein the one or more parameters includes forces, positions of objects, temperature, and weather associated with the adjustable virtual environment.

20. The method of claim 15, further comprising:

receiving, at a computing system, information indicative of a configuration of a second robotic device;

performing a given series of simulations comprising the adjustable virtual robotic device having the virtual configuration initially based on the configuration of the second robotic device executing one or more operations related to a given task in the adjustable virtual environment;

based on the given series of simulations, identifying one or more simulations of the given series of simulations in which the adjustable virtual robotic device executed respective operations related to the given task at a respective success level that satisfies the predefined threshold;

based on the identified one or more simulations of the given series of simulations, generating one or more sets of instructions that enable one or more robotic devices having respective configurations similar to the configuration of the second robotic device execute the respective operations related to the task; and storing, by the computing system, the one or more sets of instructions for providing to the one or more robotic devices.

* * * * *